US012622183B2

(12) United States Patent
Liao

(10) Patent No.: US 12,622,183 B2
(45) Date of Patent: May 5, 2026

(54) PHASE CHANGE MEMORY (PCM) CELL STRUCTURE HAVING HEATING LAYER AND FORMATION METHOD THEREFOR

(71) Applicant: CHANGXIN MEMORY TECHNOLOGIES, INC., Hefei City (CN)

(72) Inventor: Yu-Cheng Liao, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 531 days.

(21) Appl. No.: 18/155,656

(22) Filed: Jan. 17, 2023

(65) Prior Publication Data

US 2024/0008376 A1 Jan. 4, 2024

Related U.S. Application Data

(63) Continuation of application No. PCT/CN2022/108178, filed on Jul. 27, 2022.

(30) Foreign Application Priority Data

Jul. 4, 2022 (CN) .......................... 202210786445.1

(51) Int. Cl.
H10N 70/00 (2023.01)
H10B 63/00 (2023.01)
H10N 70/20 (2023.01)

(52) U.S. Cl.
CPC ......... *H10N 70/8413* (2023.02); *H10B 63/20* (2023.02); *H10B 63/80* (2023.02); *H10N 70/011* (2023.02); *H10N 70/231* (2023.02)

(58) Field of Classification Search
CPC ...... H10B 63/80; H10B 63/20; H10N 70/231; H10N 70/8413; H10N 70/011; H10N 70/063; H10N 70/20; H10N 70/882; H10N 70/826
See application file for complete search history.

(56) References Cited

U.S. PATENT DOCUMENTS

| | | | |
|---|---|---|---|
| 8,624,215 B2 | 1/2014 | Hewak | |
| 2007/0181867 A1 | 8/2007 | Hewak | |
| 2009/0194758 A1 | 8/2009 | Chen | |
| 2009/0267044 A1* | 10/2009 | Chang .................... | H10B 63/20 |
| | | | 365/163 |
| 2011/0073829 A1 | 3/2011 | Park | |
| 2013/0240820 A1 | 9/2013 | Shin et al. | |

(Continued)

FOREIGN PATENT DOCUMENTS

| | | |
|---|---|---|
| CN | 101325179 A | 12/2008 |
| CN | 100517743 C | 7/2009 |

(Continued)

*Primary Examiner* — Changhyun Yi
(74) *Attorney, Agent, or Firm* — Syncoda LLC; Feng Ma

(57) ABSTRACT

A semiconductor structure includes a substrate and a phase-change memory cell located on the substrate. The phase-change memory cell includes a phase-change material layer and a heating layer. The heating layer is located between the phase-change material layer and the substrate, and includes a first portion composed of a first conductive material and a second portion composed of a second conductive material. The first portion surrounds at least a sidewall of the second portion.

6 Claims, 18 Drawing Sheets

(56)                    References Cited

U.S. PATENT DOCUMENTS

2013/0256621 A1 *  10/2013  Park ................... H10N 70/8828
                                                        257/2
2014/0133222 A1      5/2014  Hewak et al.
2021/0242401 A1      8/2021  Wu
2022/0367807 A1 *  11/2022  Wu ..................... G11C 13/0069

FOREIGN PATENT DOCUMENTS

CN         101504967  A      8/2009
CN         112635667  A      4/2021

* cited by examiner

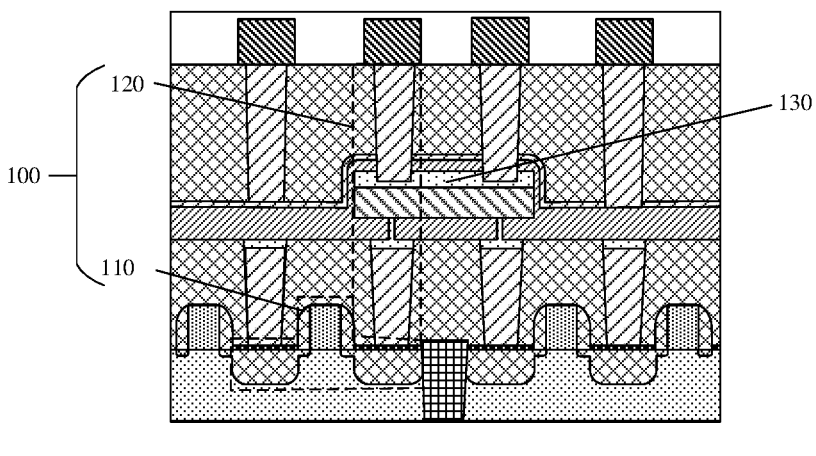
FIG. 1
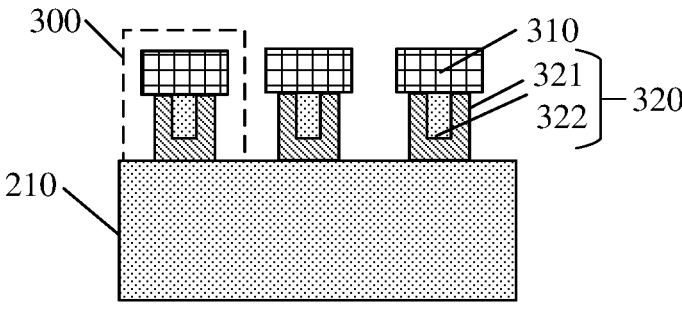
FIG. 2
FIG. 3

310  420  370

420  371

372

381

391

Y
Z X

BL0        BL1

WL0

WL1

500

Current-voltage curve of memory cell

1

PHASE CHANGE MEMORY (PCM) CELL STRUCTURE HAVING HEATING LAYER AND FORMATION METHOD THEREFOR

CROSS-REFERENCE TO RELATED APPLICATIONS

This is a continuation of International Patent Application No. PCT/CN2022/108178 filed on Jul. 27, 2022, which claims priority to Chinese Patent Application No. 202210786445.1 filed on Jul. 4, 2022. The disclosures of the above-referenced applications are hereby incorporated by reference in their entirety.

BACKGROUND

A Phase Change Memory (PCM) is a novel memory that uses a huge resistance difference between a crystalline phase-change material and an amorphous phase-change material to achieve information storage. The amorphous phase-change material has high resistance, of which molecular structure is in a disordered state. The crystalline phase-change material has low resistance, of which molecular structure is in an ordered state. A resistance difference between the phase-change materials in two states generally reaches 2 orders of magnitude.

By means of joule heat induced by current, the phase-change material can be rapidly transformed between two resistance states (i.e., a high resistance state and a low resistance state).

Since the PCM has the advantages of being strong in stability, low in power consumption, high in storage density, and compatible with a conventional CMOS process, more and more researchers and enterprises pay more attention to the PCM. The PCM is considered to be one of the most potential next-generation non-volatile memories with its huge advantages. How to improve the storage density and storage speed of the PCM has become an urgent problem to be resolved.

SUMMARY

The disclosure relates to the technical field of semiconductors, and specifically, to a semiconductor structure and a formation method therefor, and a memory.

According to a first aspect, an embodiment of the disclosure provides a semiconductor structure.

The semiconductor structure includes a substrate and a phase-change memory cell.

The phase-change memory cell is located on the substrate.

The phase-change memory cell includes a phase-change material layer and a heating layer. The heating layer is located between the phase-change material layer and the substrate.

The heating layer includes a first portion composed of a first conductive material and a second portion composed of a second conductive material. The first portion surrounds at least a sidewall of the second portion.

According to a second aspect, an embodiment of the disclosure provides a method for forming a semiconductor structure. The method includes the following operations.

A substrate is provided.

A phase-change memory cell is formed on the substrate.

The phase-change memory cell includes a phase-change material layer and a heating layer. The heating layer is located between the phase-change material layer and the substrate. The heating layer includes a first portion composed of a first conductive material and a second portion composed of a second conductive material. The first portion surrounds at least a sidewall of the second portion.

According to a third aspect, an embodiment of the disclosure further provides a memory. The memory includes a memory cell array and a peripheral circuit structure located above or outside the memory cell array, where the memory cell includes the semiconductor structure described in any one of the above embodiments.

BRIEF DESCRIPTION OF THE DRAWINGS

FIG. 1 is a schematic diagram of a phase-change memory according to some embodiments.

FIG. 2 is a first schematic cross-sectional view of a semiconductor structure according to an embodiment of the disclosure.

FIG. 3 is a second schematic cross-sectional view of a semiconductor structure according to an embodiment of the disclosure.

3

Figure 21:
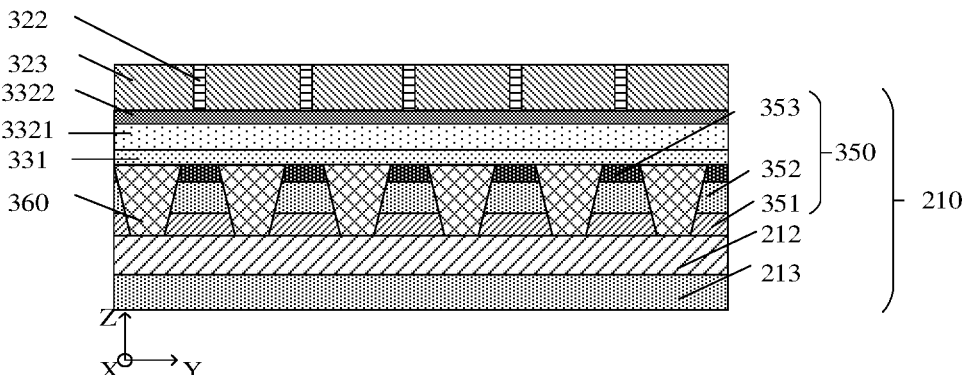

FIG. 21 is a sixth schematic cross-sectional view of a semiconductor structure according to an embodiment of the disclosure.

Figure 22:
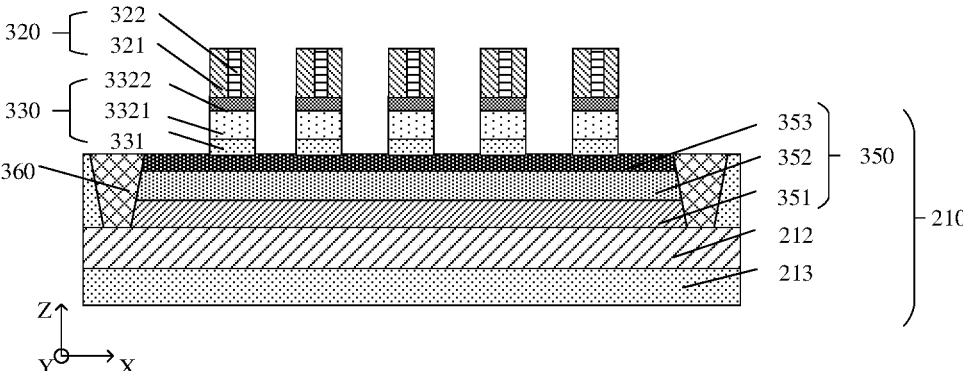

FIG. 22 is a seventh schematic cross-sectional view of a semiconductor structure according to an embodiment of the disclosure.

Figure 23:
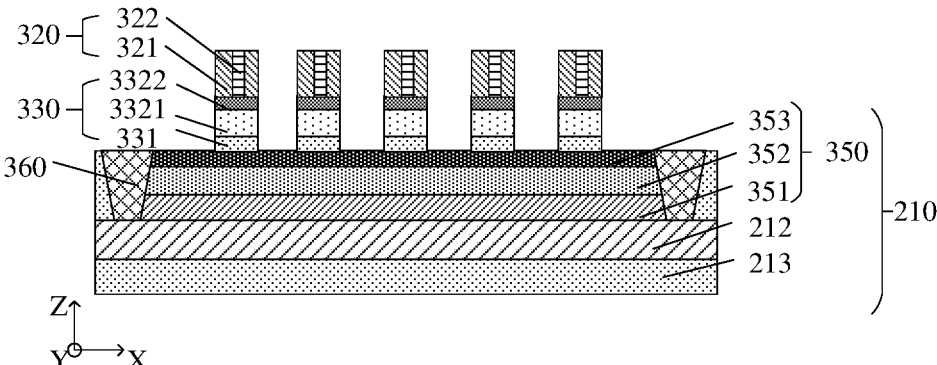

FIG. 23 is an eighth schematic cross-sectional view of a semiconductor structure according to an embodiment of the disclosure.

Figure 24:
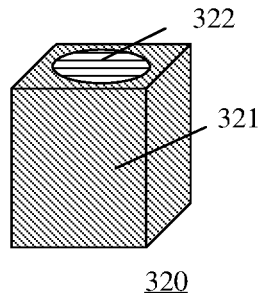

FIG. 24 is a ninth schematic cross-sectional view of a semiconductor structure according to an embodiment of the disclosure.

Figure 25:
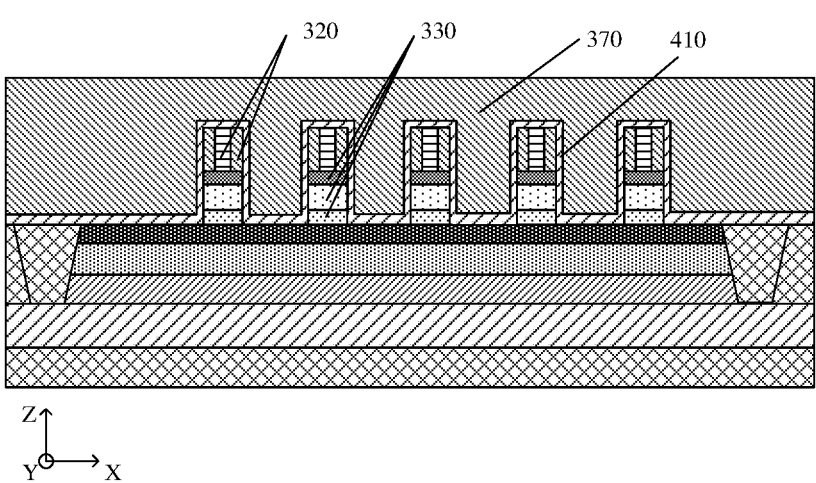

FIG. 25 is a tenth schematic cross-sectional view of a semiconductor structure according to an embodiment of the disclosure.

Figure 26:
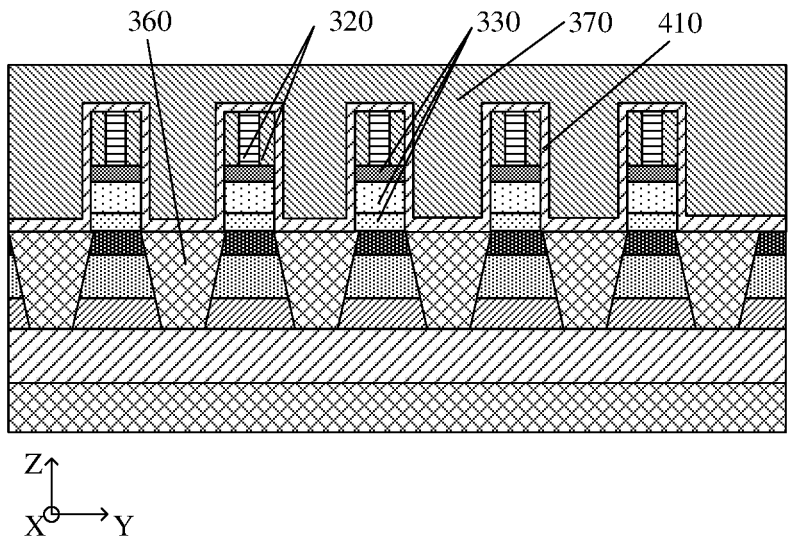

FIG. 26 is an eleventh schematic cross-sectional view of a semiconductor structure according to an embodiment of the disclosure.

Figure 27:
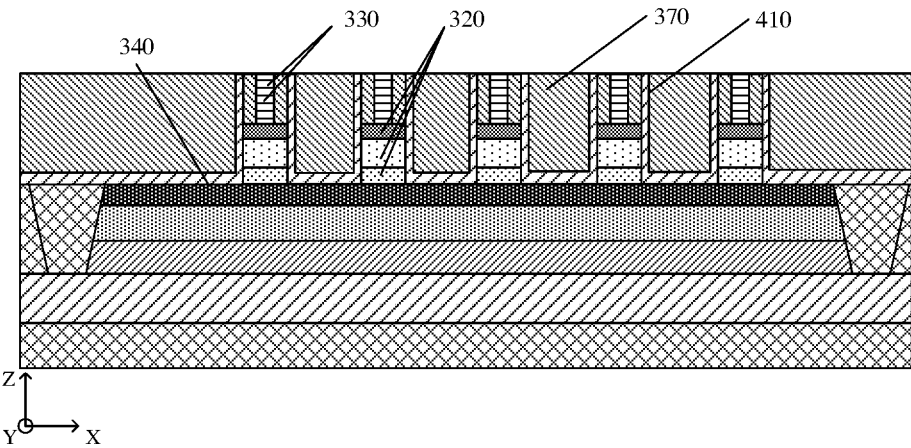

FIG. 27 is a twelfth schematic cross-sectional view of a semiconductor structure according to an embodiment of the disclosure.

Figure 28:
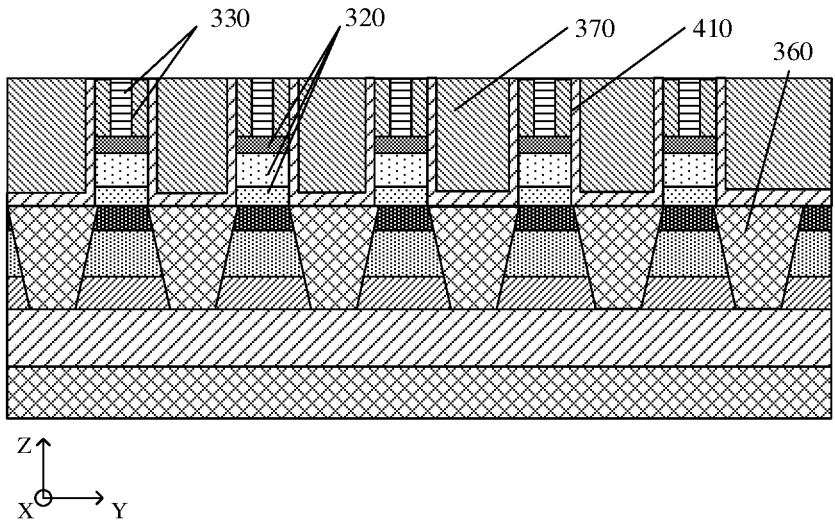

FIG. 28 is a thirteenth schematic cross-sectional view of a semiconductor structure according to an embodiment of the disclosure.

Figure 29:
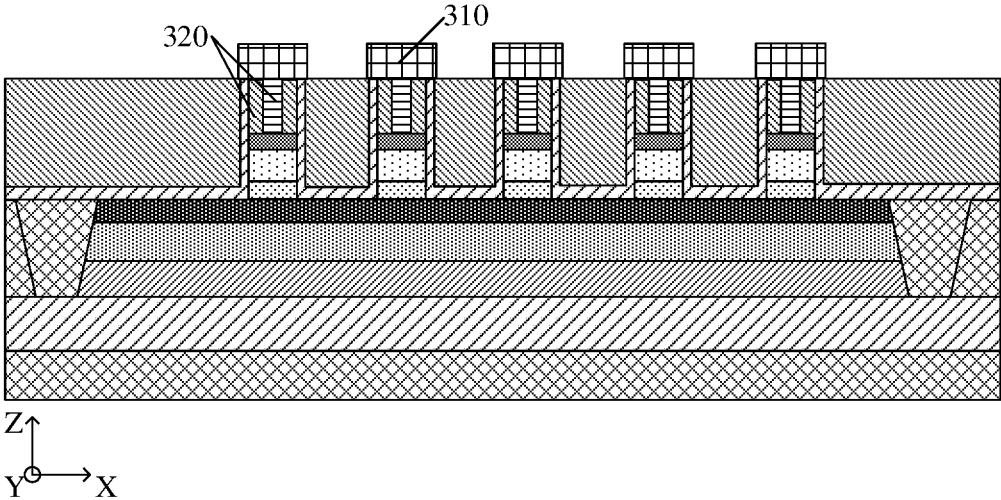

FIG. 29 is a fourteenth schematic cross-sectional view of a semiconductor structure according to an embodiment of the disclosure.

Figure 30:
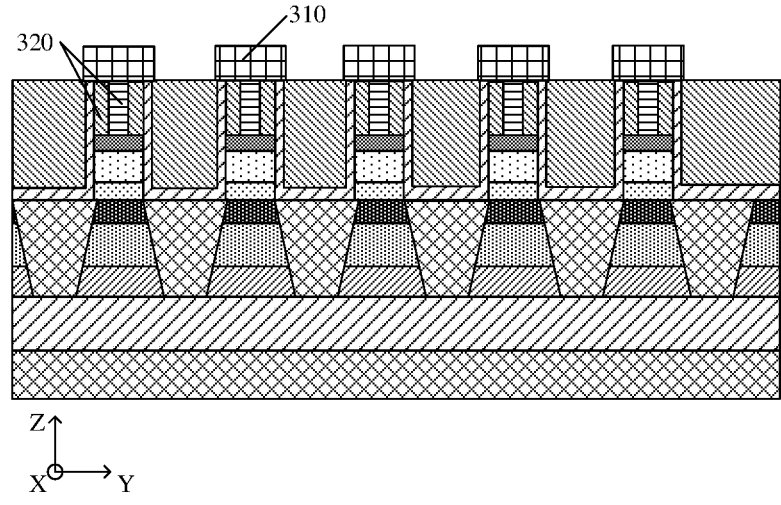

FIG. 30 is a fifteenth schematic cross-sectional view of a semiconductor structure according to an embodiment of the disclosure.

Figure 31:
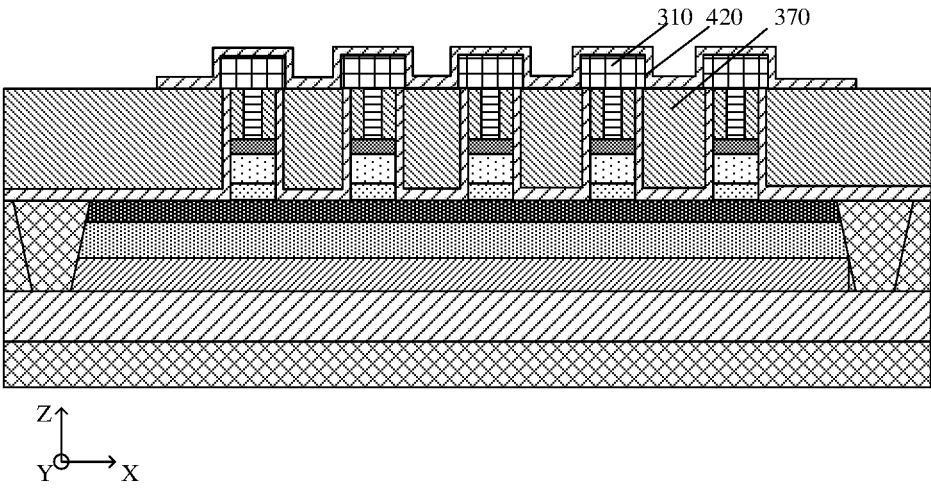

FIG. 31 is a sixteenth schematic cross-sectional view of a semiconductor structure according to an embodiment of the disclosure.

Figure 32:
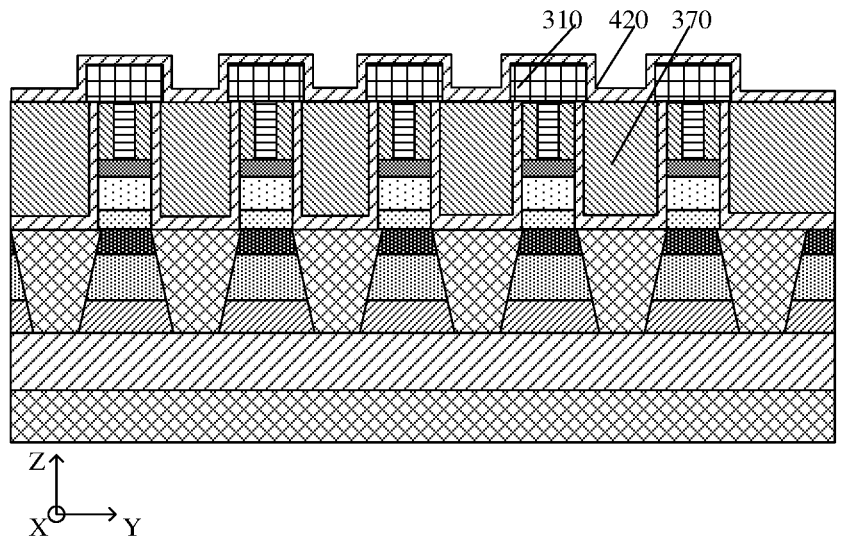

FIG. 32 is a seventeenth schematic cross-sectional view of a semiconductor structure according to an embodiment of the disclosure.

Figure 33:
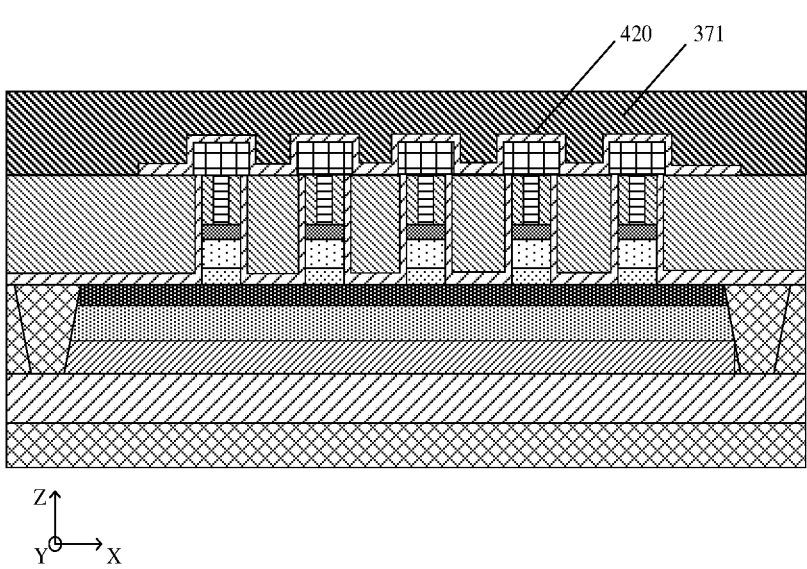

FIG. 33 is an eighteenth schematic cross-sectional view of a semiconductor structure according to an embodiment of the disclosure.

Figure 34:
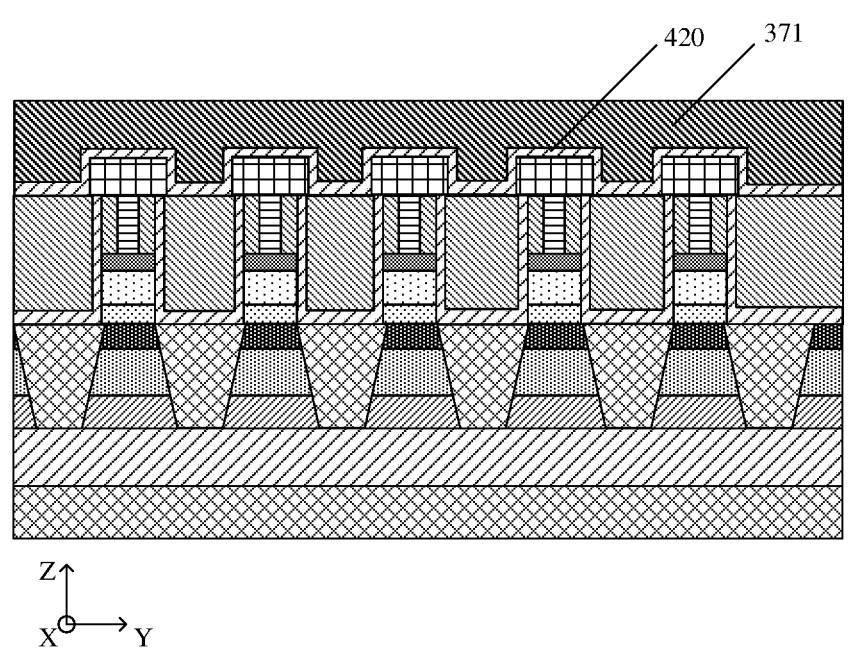

FIG. 34 is a nineteenth schematic cross-sectional view of a semiconductor structure according to an embodiment of the disclosure.

Figure 35:
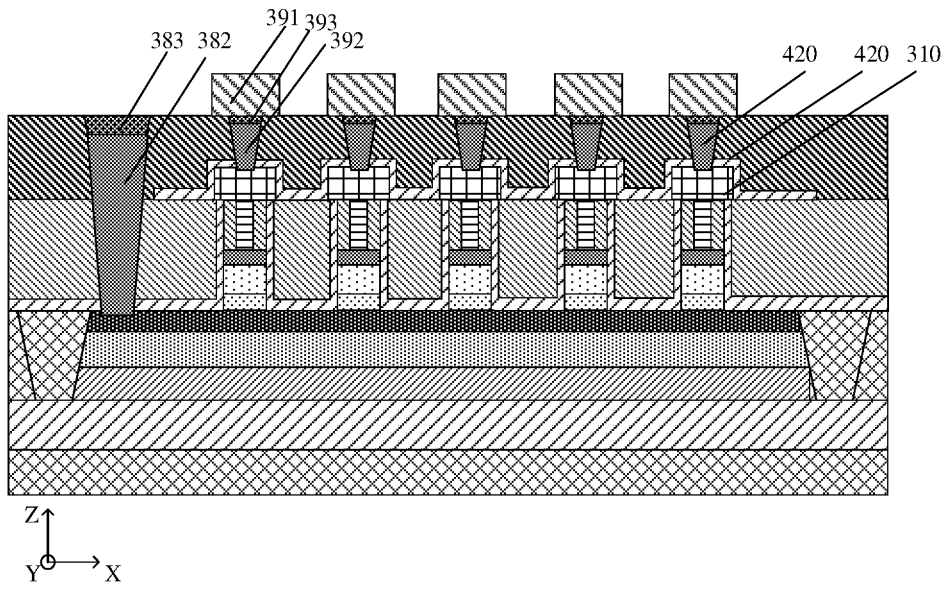

FIG. 35 is a twentieth schematic cross-sectional view of a semiconductor structure according to an embodiment of the disclosure.

Figure 36:
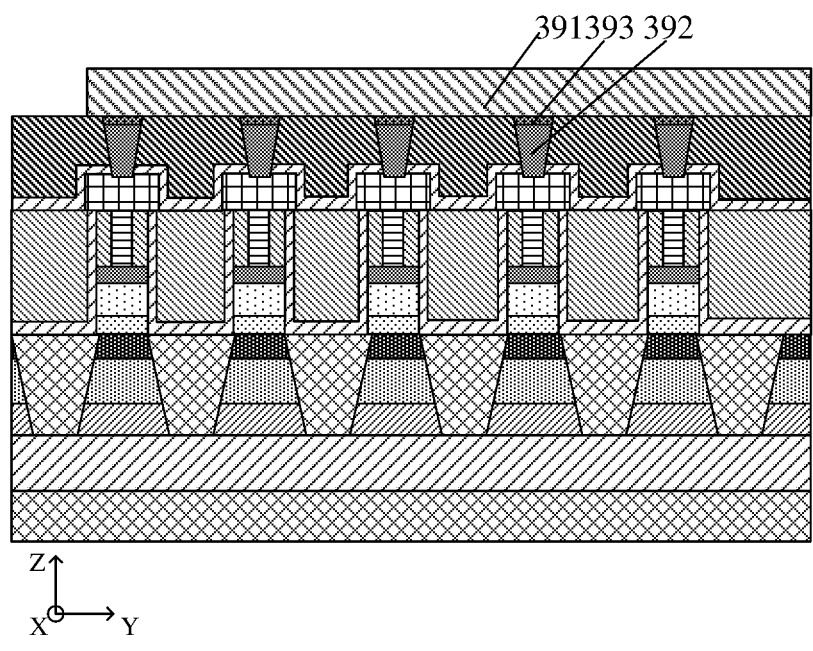

FIG. 36 is a twenty-first schematic cross-sectional view of a semiconductor structure according to an embodiment of the disclosure.

Figure 37:
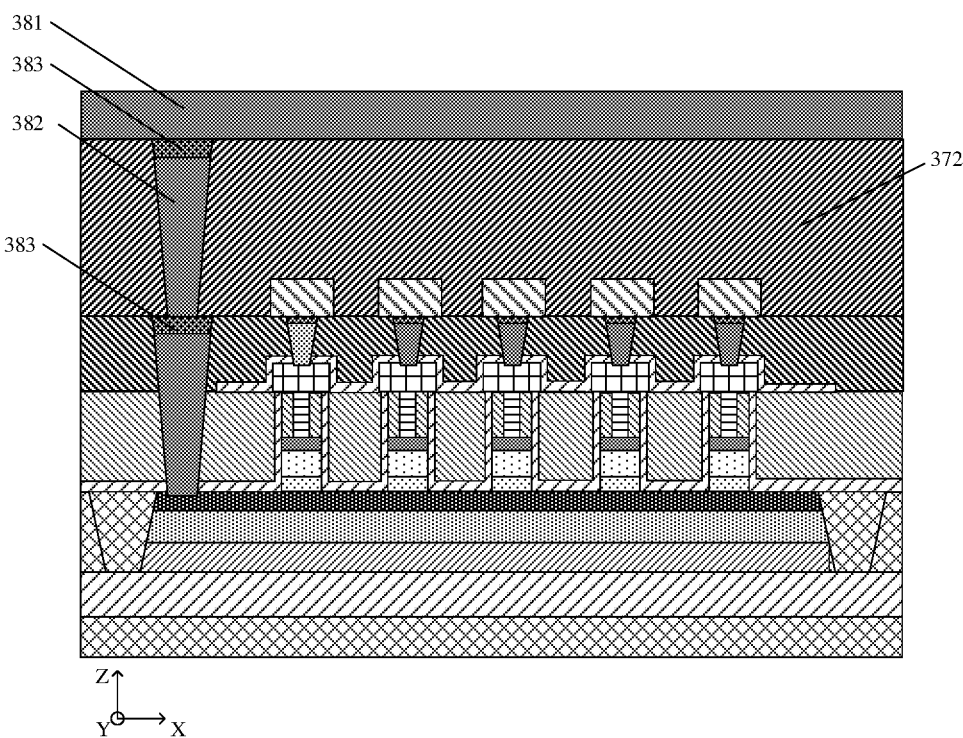

FIG. 37 is a twenty-second schematic cross-sectional view of a semiconductor structure according to an embodiment of the disclosure.

Figure 38:
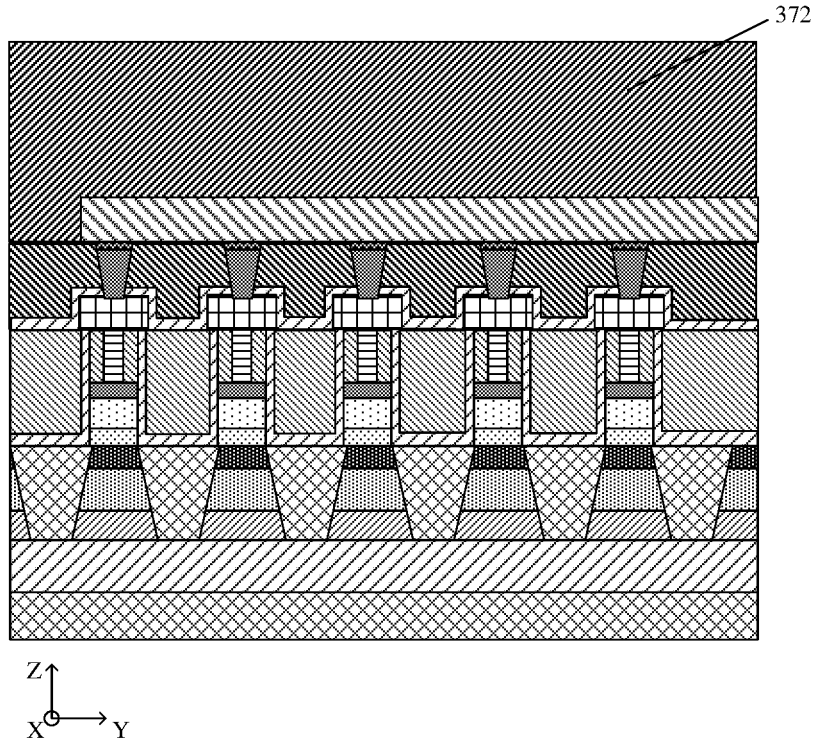

FIG. 38 is a twenty-third schematic cross-sectional view of a semiconductor structure according to an embodiment of the disclosure.

Figure 39:
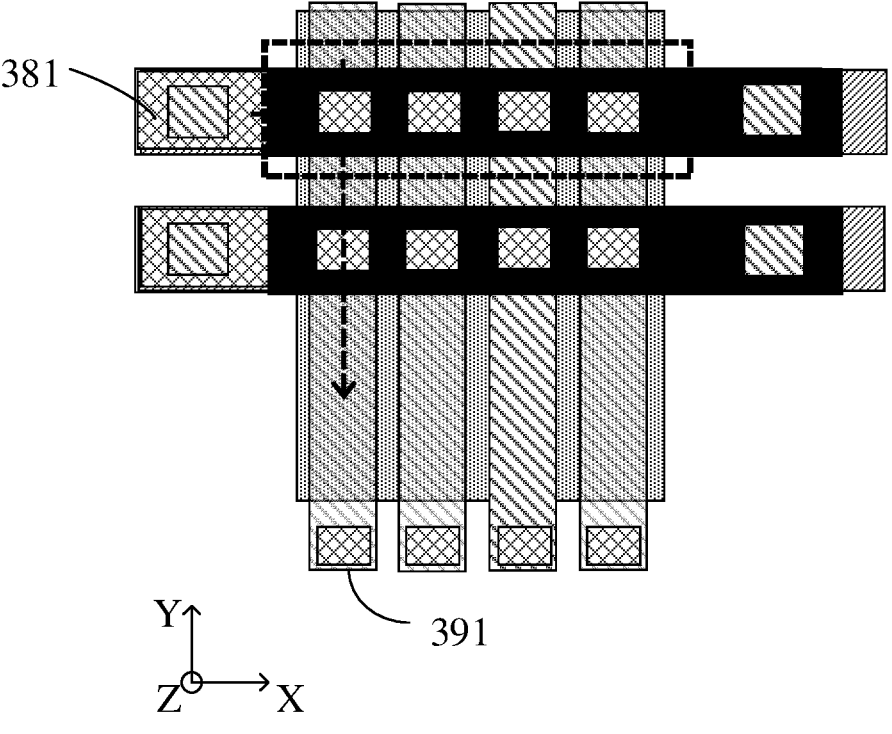

FIG. 39 is a top view of a semiconductor structure according to an embodiment of the disclosure.

Figure 40:
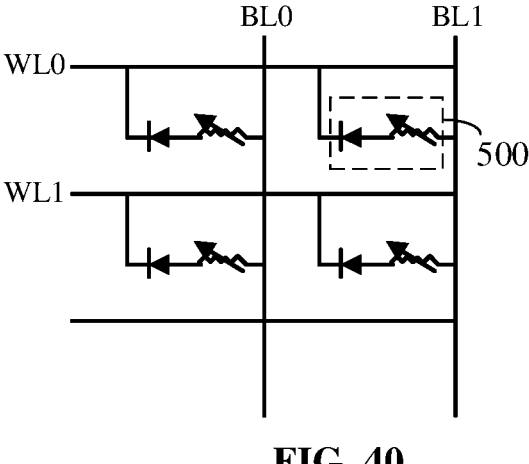

FIG. 40 is a reduced diagram of a circuit of a semiconductor structure according to an embodiment of the disclosure.

Figure 41:
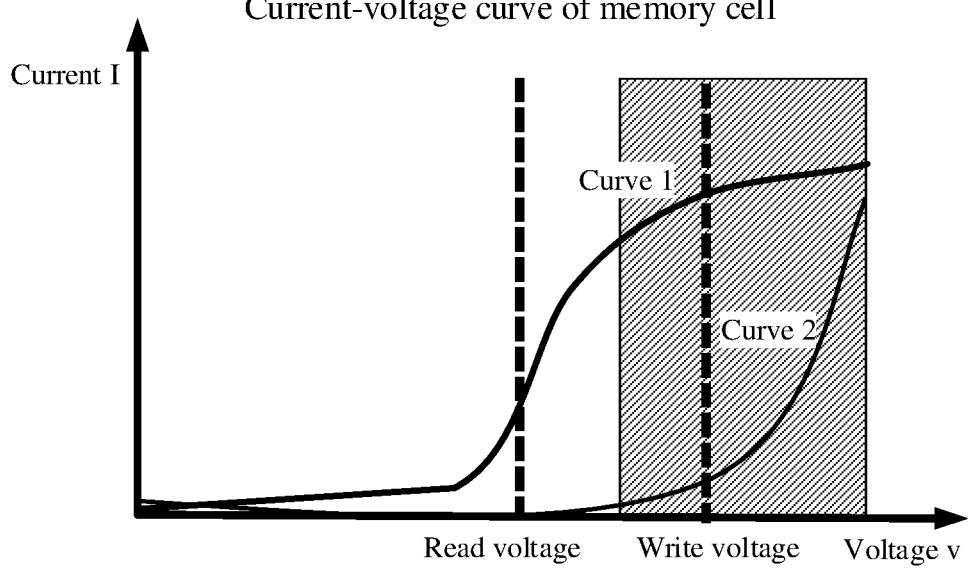

FIG. 41 is a current-voltage curve of a memory cell of a semiconductor structure according to an embodiment of the disclosure.

Figure 42:
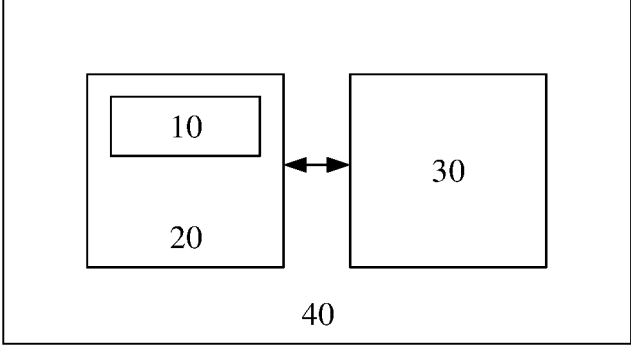

FIG. 42 is a schematic brief diagram of a memory formed by a semiconductor structure according to an embodiment of the disclosure.

DETAILED DESCRIPTION

In order to make technical solutions and advantages of the embodiments of the disclosure clearer, the technical solutions of the disclosure are further described in detail below with reference to the drawings and embodiments. Although the exemplary implementation method of the disclosure is shown in the drawings, it should be understood that the disclosure may be implemented in various forms and should not be limited by the implementations described here. On the contrary, these embodiments are provided for more thorough understanding of the disclosure, and to fully convey the scope of the disclosure to a person skilled in the art.

The disclosure is described below in more detail by means of examples with reference to the drawings. The advantages and features of the disclosure are clearer according to the following specification and claims. It is to be noted that all the drawings are in a very simple form and in an inaccurate proportion, and are merely intended to assist description of the purpose of the embodiments of the disclosure conveniently and clearly.

It is understandable that the meaning of "on", "over" and "above" in the disclosure should be interpreted in the broadest possible way, so that "on" means not only that an object is on something without intermediate features or layers (that is, the object is directly on something), but also that an object is on something with intermediate features or layers.

In addition, for ease of description, terms relating to relative space relations, such as "on", "over", "above", "upper" and "upper portion", may be used in the disclosure to describe the relation between a component or feature and another component or feature as shown in the accompanying drawings. In addition to the orientation described in the drawings, the terms relating to relative space relations are intended to cover different orientations of a device in use or operation. An apparatus may be oriented in other ways (rotated 90 degrees or in other orientations), and the description words relating to relative space relations used in the disclosure may also be explained accordingly.

In the embodiments of the disclosure, term "substrate" refers to a material on which subsequent material layers are added. The substrate itself may be patterned. The material added to the top portion of the substrate may be patterned or may remain unpatterned. In addition, the substrate may include a variety of semiconductor materials, such as silicon, silicon germanium, germanium, gallium arsenide, and indium phosphide. Alternatively, the substrate may be made of non-conductive materials, such as glass, plastic, or sapphire wafer.

In the embodiments of the disclosure, term "layer" refers to a material portion that includes an area with thickness. The layer may extend over the whole of a lower or upper structure, or may have a scope smaller than the scope of the lower or upper structure. Moreover, the layer may be an area of a homogeneous or heterogeneous continuous structure of which thickness is less than that of a continuous structure. For example, the layer may be between the top surface and the bottom surface of the continuous structure, or the layer may be between any horizontal surface pair at the top surface and bottom surface of the continuous structure. The layer may extend horizontally, vertically and/or along an inclined surface. The layer may include a plurality of sub-layers. For example, an interconnection layer may include one or more conductors and contact sub-layers (which form interconnection wires and/or through-hole contacts), and one or more dielectric sub-layers.

In the embodiment of the disclosure, terms "first", "second" and the like are used for distinguishing similar objects rather than describing a specific sequence or a precedence order.

A deposition process in the embodiments of the disclosure includes, but is not limited to, Chemical Vapor Deposition (CVD), Physical Vapor Deposition (PVD), Plasma Enhanced CVD (PECVD), sputtering, Metal Organic Chemical Vapor Deposition (MOCVD), Atomic Layer Deposition (ALD) and a combination thereof.

A growth process in the embodiments of the disclosure includes, but is not limited to, Vapour Phase Epitaxy (VPE), Liquid Phase Epitaxy (LPE), Molecular Beam Epitaxy (MBE), ion beam epitaxy, solid phase epitaxy, and a combination thereof.

An etching process in the embodiments of the disclosure includes, but is not limited to, dry etching, wet etching, and a combination thereof.

A semiconductor structure involved in the embodiments of the disclosure is at least a portion that will be used in the subsequent processing to form the structure of a final device. Herein, the final device may include a three-dimensional Phase Change Memory (PCM), or other storage chips or processing chips including PCM memory cells.

A PCM is a novel memory that uses a huge resistance difference between a crystalline phase-change material and an amorphous phase-change material to achieve information storage. The amorphous phase-change material has high resistance, of which molecular structure is in a disordered state. The crystalline phase-change material has low resistance, of which molecular structure is in an ordered state. A resistance difference between the phase-change materials in the two states generally reaches 2 orders of magnitude.

By means of joule heat induced by current, the phase-change material can be rapidly transformed between two resistance states (i.e., the high resistance state and low resistance state). Since the PCM has the advantages of being strong in stability, low in power consumption, high in storage density, and compatible with a conventional CMOS process, more and more researchers and enterprises pay more attention to the PCM. The PCM is considered to be one of the most potential next-generation non-volatile memories with its huge advantages.

In the embodiments of the disclosure, two conductive materials are used to form the heating layer, and the heating layer has the first portion and the second portion. In addition, the first portion surrounds at least a sidewall of the second portion. In this way, heating efficiency can be enhanced by using the advantage of the conductive material of the second portion, and heat is not easy to dissipate after heating by using the first portion to surround the second portion, thereby facilitating the further enhancement of the heating efficiency. After the heating efficiency is enhanced, the enhanced heating efficiency can shorten the time required for the phase transition of the phase-change material layer, so that the occurrence of phase transition can be faster, thereby accelerating the rate of data writing.

In some embodiments, as shown in FIG. 1, a phase-change memory cell 100 in the PCM includes a planar MOS tube 110 and a phase-change unit 120. The phase-change unit 120 includes a Key Heater (KH) structure. A resistance value of a phase-change material in a phase-change material layer 130 in the phase-change unit 120 may be changed by means of the KH structure. The amorphous phase-change material has high resistivity, which may be used to store data "1"; and the crystalline phase-change material has low resistivity, which may be used to store data "0". Therefore, the reversible phase transition of the phase-change material is used to store information.

An embodiment of the disclosure provides a semiconductor structure. As shown in FIG. 2, the semiconductor structure includes: a substrate 210; a phase-change memory cell 300, located on the substrate 210; and a phase-change material layer 310 and a heating layer 320. The heating layer 320 is located between the phase-change material layer 310 and the substrate 210. The heating layer 320 includes a first portion 321 composed of a first conductive material and a second portion 322 composed of a second conductive material. The first portion 321 surrounds at least a sidewall of the second portion 322.

The substrate 210 may include a P-type semiconductor material substrate (for example, a Silicon (Si) substrate, a germanium (Ge) substrate, or the like), an N-type semiconductor material substrate (for example, an Indium Phosphide (InP) substrate), a compound semiconductor material substrate (for example, a Silicon Germanium (SiGe) substrate), a Silicon-On-Insulator (SOI) substrate, a Germanium-On-Insulator (GeOI) substrate, and the like. In this embodiment of the disclosure, the SOI substrate or the GeOI substrate may be selected preferably, so as to reduce the leakage current of the substrate.

The substrate 210 may have an array composed by a plurality of phase-change memory cells 300. The phase-change memory cell is used to implement functions of storing, reading and writing data.

Each phase-change memory cell 300 may include the phase-change material layer 310 and the heating layer 320 located between the phase-change material layer 310 and the substrate 210. The phase-change material layer 310 that may be used to store data has at least two solid phase structure that can be obviously distinguished. For example, one state may be an amorphous state, and the phase-change material layer 310 may have high resistance when being in the amorphous state; and the other state may be a crystalline state, and the phase-change material layer may have low resistance when being in the crystalline state. The stored data "0" and "1" are distinguished by using the resistance values having an obvious difference when the phase-change material layer 310 is in the amorphous and crystalline states. The transition from a metastable amorphous state to a stable crystalline state may be achieved by heating the phase-change material in the amorphous state to a crystallization temperature and performing heating for a sufficient time to cause the phase-change material in amorphous state to be fully crystallized. From the stable crystalline state to the amorphous state, a crystalline structure may be heated to melt and rapidly cooled. That is to say, the amorphous state is obtained through coagulation by undergoing a rapid annealing process. The phase-change material layer 310 may be prepared by using chalcogenide glass. Chalcogenide includes four elements of Group VIA in a periodic table of elements, which are Oxygen (O), Sulfur (S), Selenium (Se) and Tellurium (Te). A material of the phase-change material layer 310 includes, but is not limited to, Germanium Antimony Tellurium (GeSbTe) alloy, or may include at least one or more of the following alloys: Gallium/Antimony (Ga/Sb), Indium/Antimony (In/Sb), Indium/Selenium (In/Se), Antimony/Tellurium (Sb/Te), Germanium/Tellurium (Ge/Te), Germanium/Antimony/Tellurium (Ge/Sb/Te), Indium/Antimony/Tellurium (In/Sb/Te), Gallium/Selenium/Tellurium (Ga/Se/Te), Tin/Antimony/Tellurium (Sn/Sb/Te), Indium/Antimony/Germanium (In/Sb/Ge), Silver/Indium/Antimony/Tellurium (Ag/In/Sb/Te), Germanium/Tin/Antimony/Tellurium (Ge/Sn/Sb/Te), Germanium/Antimony/Selenium/Tellurium (Ge/Sb/Se/Te) and Tellurium/Germanium/Antimony/Sulfur (Te/Ge/Sb/S).

The phase-change memory cell 300 further includes the heating layer 320. The heating layer 320 may be located under the phase-change material layer 310. The heating layer 320 is configured to heat the phase-change material layer 310, so as to change a phase state of the phase-change material layer.

The heating layer 320 in this embodiment of the disclosure includes a first portion 321 composed of a first conductive material and a second portion 322 composed of a second conductive material. The first portion 321 surrounds at least a sidewall of the second portion 322. By using two conductive materials, the advantages of the two conductive materials may be combined, so that a reset current of the PCM is lower, and heating efficiency is higher. By means of the enhancement of the heating efficiency, state switching may be performed on the phase-change memory cell by using a lower operating voltage.

In some embodiments, as shown in FIG. 2, the second portion 322 penetrates the first portion 321, is in contact with the substrate 210, and has a contact surface.

In some embodiments, as shown in FIG. 3, the bottom of the second portion 322 is connected to the first portion 321, but is not in contact with the substrate.

Figure 4:
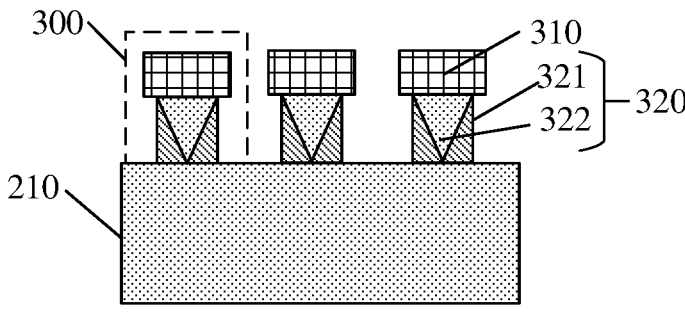
FIG. 4 is a third schematic cross-sectional view of a semiconductor structure according to an embodiment of the disclosure.

In some embodiments, as shown in FIG. 4, the second portion 322 penetrates the first portion 321 and is in partial contact with the substrate 210.

Figure 5:
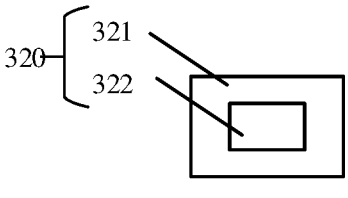
FIG. 5 is a first schematic top cross-sectional view of a heating layer according to an embodiment of the disclosure.
Figure 6:
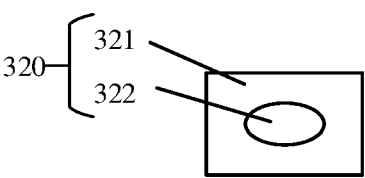
FIG. 6 is a second schematic top cross-sectional view of a heating layer according to an embodiment of the disclosure.
Figure 7:
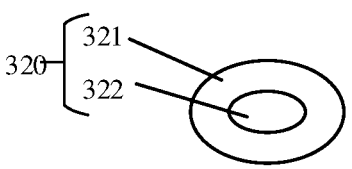
FIG. 7 is a third schematic top cross-sectional view of a heating layer according to an embodiment of the disclosure.
Figure 8:
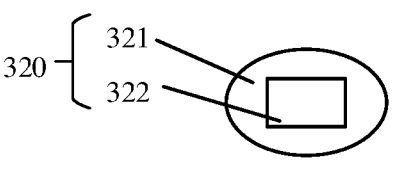
FIG. 8 is a fourth schematic top cross-sectional view of a heating layer according to an embodiment of the disclosure.

A top cross-sectional view of the heating layer 320 is shown in FIG. 5 to FIG. 8. As shown in FIG. 5, the top view of the heating layer 320 may be a quadrilateral (including a square); the top view of the second portion 322 may be a quadrilateral (including a square); and the top view of the first portion 321 may be a quadrilateral with a quadrangle cut out in the middle. As shown in FIG. 6, the top view of the first portion 321 may be a quadrilateral (including a square); the top view of the second portion 322 may be an ellipse (including a circle); and the top view of the first portion 321 may be a quadrilateral with an ellipse cut out in the middle. As shown in FIG. 7, the top view of the first portion 321 may be an ellipse (including a circle); the top view of the second portion 322 may be an ellipse (including a circle); and the top view of the first portion 321 may be an ellipse with an ellipse cut out in the middle. As shown in FIG. 8, the top view of the first portion 321 may be an ellipse (including a circle); the top view of the second portion 322 may be a quadrilateral (including a square); and the top view of the first portion 321 may be an ellipse with a quadrilateral cut out in the middle. The above are only 4 examples of the top cross-sectional views of the heating layer 320. The top cross-sectional view of the heating layer 320 or the first portion 321 may also include a triangle and other polygons, which is not described herein again.

However, regardless of the structure, the first portion 321 surrounds at least the sidewall of the second portion 322, so that the loss of heat after the conductive material used by the second portion is heated can be reduced, thereby enhancing the heating efficiency.

In the embodiments of the disclosure, two conductive materials are used to form the heating layer 320, and the heating layer 320 has the first portion 321 and the second portion 322. In addition, the first portion 321 surrounds at least the sidewall of the second portion 322. In this way, heating efficiency can be enhanced by using the advantage of the conductive material of the second portion, and heat is not easy to dissipate after heating by means of the structure advantage of using the first portion to surround the second portion, thereby facilitating the further enhancement of the heating efficiency. After the heating efficiency is enhanced, the time for the phase transition of the phase-change material layer 310 is shorter, so that the occurrence of phase transition can be faster, thereby accelerating the rate of data writing.

In some embodiments, first electrical conductivity of the first conductive material is less than second electrical conductivity of the second conductive material.

The first conductive material and the second conductive material may be tungsten, titanium, copper, and compounds thereof.

In the embodiments of the disclosure, the first electrical conductivity of the first conductive material may be less than the second electrical conductivity of the second conductive material. That is to say, when the first conductive material is selected, the first electrical conductivity of the first conductive material is also determined accordingly. The second conductive material may be selected from materials of which electrical conductivities are greater than the first electrical conductivity. In this way, most of currents can be guaranteed to flow to the second portion when a heater is used.

In some embodiments, when the first conductive material is selected, first thermal conductivity of the first conductive material is determined accordingly. When the second conductive material is selected, the second conductive material may be selected from conductive materials meeting the following condition. The condition is that second thermal conductivity of the second conductive material is greater than the first thermal conductivity of the first conductive material. In this way, the thermal conduction property of the second portion is stronger than the thermal conduction property of the first portion, so that the heat in the first portion is not easy to dissipate.

Exemplarily, the first conductive material may be TaN, and the second conductive material may be TiN. The TaN has a good anti-heat dissipation effect and is also a kind of conductor, and a TiN/TaN structure has a desirable current ratio.

In the embodiments of the disclosure, the resistance of the heating layer can be increased by using the structure that the first portion surrounds at least the sidewall of the second portion, and by using the materials meeting the condition that the first thermal conductivity of the first conductive material is less than the second thermal conductivity of the second conductive material, heat sources are further concentrated in the heater, so that the heating effect can be enhanced.

In some embodiments, a sidewall and at least partial upper surface of the phase-change memory cell are covered by a thermal insulation layer. Third thermal conductivity of a material used by the thermal insulation layer may be less than the first thermal conductivity of the first conductive material. In this way, the heat dissipation effect of the thermal insulation layer is worse than that of the first conductive material, so that the heat source of the heater is not easy to dissipate, thereby enhancing the heating effect. In addition, by means of the coating effect of the thermal insulation layer, the heating effect may be facilitated.

In some embodiments, the thermal insulation layer may select an insulation material, preferably, may select Silicon Nitride (SiN).

Figure 9:
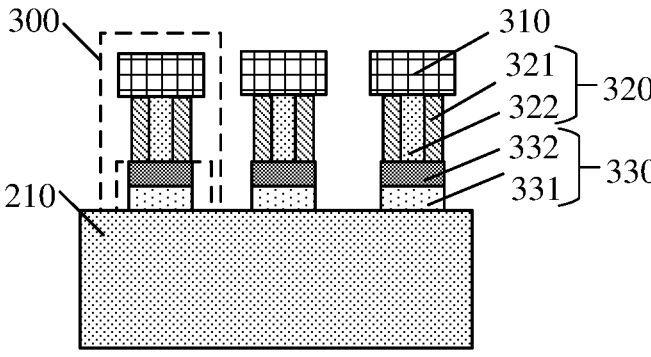
FIG. 9 is a first schematic cross-sectional view of a semiconductor structure according to an embodiment of the disclosure.

In some embodiments, as shown in FIG. 9, the phase-change memory cell 300 further includes a diode 330 which is perpendicular to the substrate 210. The diode 330 is located between the substrate 210 and the heating layer 320. A conducting direction of the diode 330 is directed from the heating layer 320 towards the substrate 210.

The diode 330 is located between the substrate 210 and the heating layer 320 and is disposed perpendicular to a surface of the substrate 210, so that a current may flow from the heating layer 320 to the substrate 210. That is to say, a flow direction of the current may be perpendicular to the surface of the substrate 210. There may be one or more diodes 330. A plurality of diodes 330 may be serially connected between the substrate 210 and the heating layer 320. The diode 330 may generate the current when being turned on, so as to drive the phase-change memory cell 300 to perform operations of writing, reading and erasing data.

In some embodiments, as shown in FIG. 9, the diode 330 includes a first ion implantation structure 331 and a second ion implantation structure 332. The first ion implantation structure 331 is located on the substrate 210, and the second ion implantation structure 332 is located on the first ion implantation structure 331. An ion type of the first ion implantation structure 331 is opposite to an ion type of the second ion implantation structure 332.

The first ion implantation structure 331 may be formed by means of doping on the substrate 210, or may be formed by doping an epitaxy layer that is formed by performing epitaxial growth on the substrate 210. A doped impurity type may be divided into an N type and a P type. The N type impurity mainly includes Phosphorus (P), Arsenic (As), Antimony (Sb), and the like. The P type impurity mainly includes Boron (B), Indium (In), and the like.

The second ion implantation structure 332 may be formed by means of doping on the substrate 210, or may be formed by doping an epitaxy layer that is formed by performing epitaxial growth on the substrate 210. A doped impurity type may be divided into an N type and a P type. The N type impurity mainly includes Phosphorus (P), Arsenic (As), Antimony (Sb), and the like. The P type impurity mainly includes Boron (B), Indium (In), and the like.

It is to be noted here that, since the first ion implantation structure 331 and the second ion implantation structure 332 are configured to form the diode 330, the types of the implanted impurities of the first ion implantation structure 331 and the second ion implantation structure 332 are opposite to each other. In the embodiments of the disclosure, the first ion implantation structure 331 may be N-type doped, and the second ion implantation structure 332 may be P-type doped.

In some embodiments, if the first ion implantation structure 331 and the second ion implantation structure 332 are both formed by means of doping on the substrate, a first implantation depth for forming the first ion implantation structure 331 should be deeper than a second implantation depth for forming the second ion implantation structure 332.

In some embodiments, if the first ion implantation structure 331 and the second ion implantation structure 332 are both formed by doping the epitaxy layer that is formed by performing epitaxial growth on the substrate 210, a first epitaxy layer may be first formed by means of first epitaxial growth, and then the first epitaxy layer is doped to form the first ion implantation structure. Then, the first epitaxy layer is doped to form the first ion implantation structure 331, and a second epitaxy layer is doped to form the second ion implantation structure 332.

Figure 10:
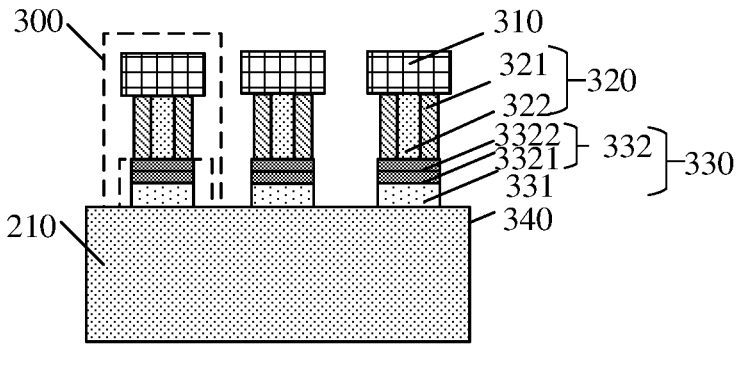
FIG. 10 is a second schematic cross-sectional view of a semiconductor structure according to an embodiment of the disclosure.

In some embodiments, as shown in FIG. 10, the second ion implantation structure 332 includes an upper-layer second ion implantation structure 3322 and a lower-layer second ion implantation structure 3321. An ion concentration of the upper-layer second ion implantation structure 3322 is different from an ion concentration of the lower-layer second ion implantation structure 3321.

The second ion implantation structures 332 may include at least two layers. When the second ion implantation structure includes two layers, the second ion implantation structure has the upper-layer second ion implantation structure 3322 and the lower-layer second ion implantation structure 3321. The type of doped ions of the upper-layer second ion implantation structure 3322 may be the same as the type of doped ions of the lower-layer second ion implantation structure. For example, if the doped ions of the upper-layer second ion implantation structure 3322 are P-type doped ions, the doped ions of the lower-layer second ion implantation structure may also be the P-type doped ions.

In some embodiments, the ion concentration of the upper-layer second ion implantation structure 3322 is different from the ion concentration of the lower-layer second ion implantation structure 3321. For example, the ion concentration of the upper-layer second ion implantation structure 3322 may be greater than the ion concentration of the lower-layer second ion implantation structure 3321. Doping the upper-layer second ion implantation structure 3322 with high-concentration ions may be used to increase the conductivity of a PN junction in the diode 330. The lower-layer second ion implantation structure 3321 may adjust a threshold voltage of the diode 330 by means of the doped ion concentration and thickness of the lower-layer second ion implantation structure. The performance of the diode 330 may be improved by using a multi-layered structure to form the second ion implantation structures 332.

Figure 11:
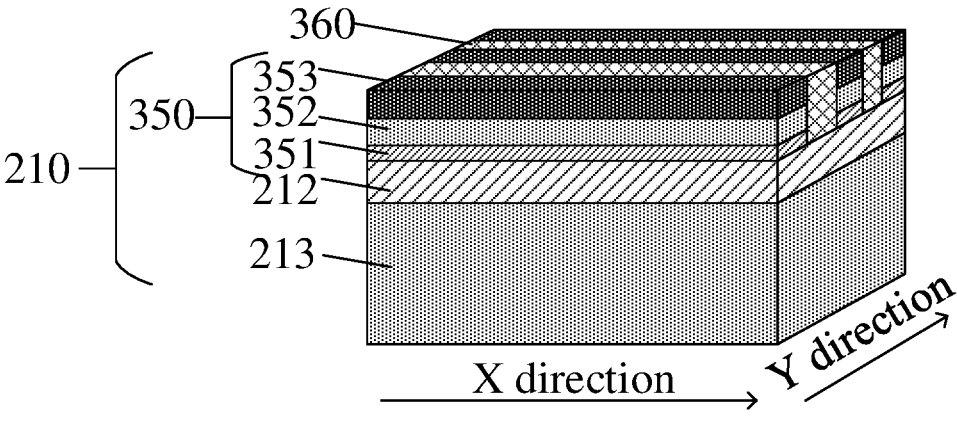
FIG. 11 is a third schematic cross-sectional view of a semiconductor structure according to an embodiment of the disclosure.

In some embodiments, as shown in FIG. 11 (FIG. 11 being a schematic diagram of a three-dimensional structure of the substrate), the substrate includes: a backing substrate 213; a buried oxide layer 212, located on the backing substrate 213; a doped structure 350, located on the buried oxide layer 212 and in direct contact with the first ion implantation structure; and a shallow trench isolation structure 360, located between the adjacent doped structures 350.

The doped structure 350 is in direct contact with the first ion implantation structure, so as to be connected to a plurality of phase-change memory cells arranged in a first direction. That is to say, contact points or contact surfaces between the plurality of phase-change memory cells in the first direction and the doped structure 350 are equipotential. The first direction may be any direction parallel to the surface of the substrate. In some embodiments, the first direction may be the same as a direction of a word line or a bit line formed subsequently.

The doped structure 350 may be formed by doping the top-layer silicon on the buried oxide layer 212 for a plurality of times.

Figure 12:
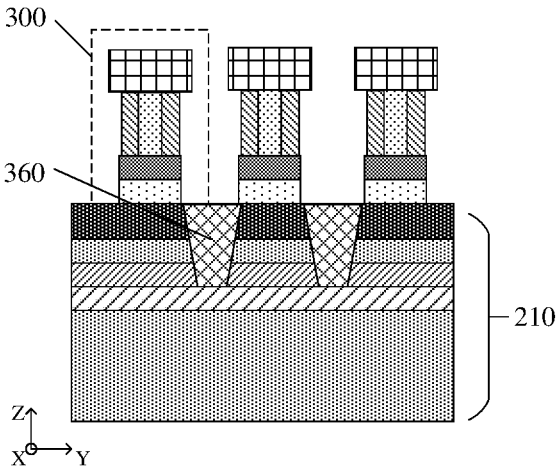
FIG. 12 is a fourth schematic cross-sectional view of a semiconductor structure according to an embodiment of the disclosure.

In some embodiments, as shown in FIG. 11, the substrate is provided with the doped structure 350. As shown in FIG. 12 (FIG. 12 being a cross-sectional view of the semiconductor structure in a Y direction), the semiconductor structure further includes a shallow trench isolation structure 360 which is located between the adjacent doped structures 350. Herein, the shallow trench isolation structure 360 is configured to isolate the adjacent doped structures 350.

Specifically, the shallow trench isolation structure 360 is configured to isolate the adjacent doped structures 350 in the Y direction, so that the phase-change memory cells 300 that do not overlap in the Y direction are electrically isolated from each other. The Y direction may be perpendicular to or intersect with an X direction.

A material of the shallow trench isolation structure 360 may be an insulation material, such as silicon oxide, nitride and a combination thereof.

In some embodiments, as shown in FIG. 11, the doped structure includes; an N well 351, located on the buried oxide layer 212; a P well 352, located on the N well 351; and a third ion implantation structure 353, located on a surface of the P well 352 and in direct contact with the first ion implantation structure.

In some embodiments, ion implantation with different depths may be performed on the top-layer silicon for three times, so as to form an N-well layer, a P-well layer, and a third ion implantation structure layer. The N-well layer is doped with N-type ions, and the P-well layer is doped with P-type ions. The type of the doped ions of the third ion implantation structure layer may be the same as the type of the doped ions that are implanted in the first ion implantation structure.

The N-well layer, the P-well layer and the third ion implantation structure layer are etched to form the doped structure 350 composed of the N well 351, the P well 352 and the third ion implantation structure 353. The third ion implantation structure 353 is in contact with the first ion implantation structure, so that the current may flow into the first ion implantation structure from the third ion implantation structure 353. The third ion implantation layer may be formed by means of heavy doping, so that the subsequently formed third ion implantation structure is also heavily doped, which has the characteristics of being low in resistivity, small in resistance and enhanced conductivity.

The N well and the P well are configured to form a reversed-biased PN junction so as to isolate the phase-change memory cell 300 from the buried oxide layer 212 and the backing substrate 213, so that electric leakage can be avoided.

Figure 13:
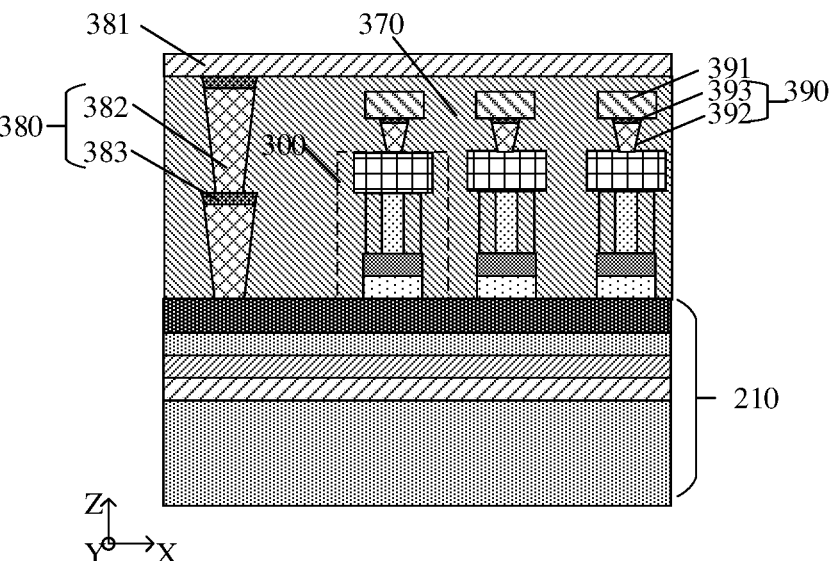
FIG. 13 is a fifth schematic cross-sectional view of a semiconductor structure according to an embodiment of the disclosure.

In some embodiments, as shown in FIG. 13, the semiconductor structure further includes: an interlayer dielectric layer 370, located between the phase-change memory cells 300; and a first conductive structure 380, penetrating the interlayer dielectric layer 370 and connected to the third ion implantation structure 353.

There may be an interlayer dielectric layer 370 between the phase-change memory cells 300. The interlayer dielectric layer 370 is configured to electrically isolate the phase-change memory cells 300, so as to reduce parasitic capacitance. A material of the interlayer dielectric layer 370 may be an insulation material.

Each third ion implantation structure 353 may be connected to a respective first conductive structure 380 penetrating the interlayer dielectric layer 370.

The first conductive structure 380 includes at least one first Contact (CT) 382. There may be one or more first CTs that are mutually stacked.

A first conductive plug 383 is arranged above the first CT 382. The first conductive plug 383 is configured to reduce ohmic contact between the adjacent first CTs 382 or between the first CT 382 and other structures.

A material of the first CT 382 may be a metal material.

A material of the first conductive plug 383 may be a metal, such as Ti and/or TiN.

In some embodiments, as shown in FIG. 13, the semiconductor structure further includes a second conductive structure 390 which is connected to the phase-change memory cell 300. The first conductive structure 380 is connected to a first conductive wire 381 extending in the first direction parallel to the substrate. The second conductive structure 390 is connected to a second conductive wire 391 extending in the second direction parallel to the substrate. The second direction intersects with the first direction.

In some embodiments, the plurality of phase-change memory cells that overlap in the first direction (X direction) may further share the same second conductive structure 390. The adjacent second conductive structures 390 are parallel to each other in the second direction (Y direction).

The second conductive structure includes at least one second CT 392. There may be one or more second CTs that are mutually stacked. A second conductive plug 393 is arranged above the second CT 392. The second conductive plug 393 is configured to reduce ohmic contact between the adjacent second CTs 392 or between the second CT 392 and other structures. A material of the second CT 392 may be a metal material. A material of the second conductive plug 393 may be a metal, such as Ti and/or TiN.

In some embodiments, the second conductive structure further includes the second conductive wire 391. The second conductive wire extends in the Y direction. The first conductive structure 380 further includes the first conductive wire 381. The first conductive wire 381 extends in the X direction. The first conductive wire 381 may be configured to form a word line or a bit line. The second conductive wire 391 may also be configured to form the word line or the bit line. In some embodiments, the first conductive wire 381 does not intersect with the second conductive wire 391 in space. That is to say, there may be an interlayer dielectric layer between the first conductive wire 381 and the second conductive wire 391. In the embodiments of the disclosure, if the first conductive wire 381 may be the word line, the second conductive wire 391 may be the bit line. By applying different voltages to the bit line and/or the word line, data storage and reading may be performed on the phase-change memory cell.

Figure 14:
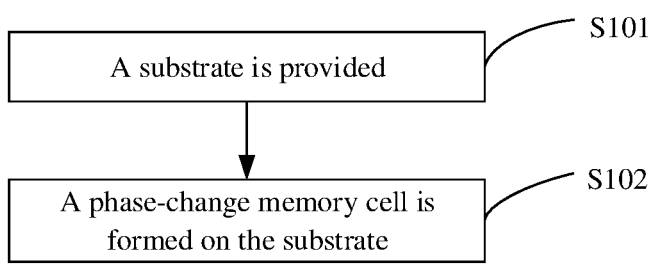
FIG. 14 is a flowchart of a method for forming a semiconductor structure according to an embodiment of the disclosure.

An embodiment of the disclosure further provides a method for forming a semiconductor structure. As shown in FIG. 14, the method includes the following operations.

At S101, a substrate is provided.

At S102, a phase-change memory cell is formed on the substrate.

The phase-change memory cell includes a phase-change material layer and a heating layer. The heating layer is located between the phase-change material layer and the substrate. The heating layer includes a first portion composed of a first conductive material and a second portion composed of a second conductive material. The first portion surrounds at least a sidewall of the second portion.

Firstly, operation S101 of providing the substrate is executed. A surface of the substrate is any surface perpendicular to a thickness direction of the substrate. The thickness direction of the substrate or the direction perpendicular to the surface of the substrate is defined as a Z direction. Any direction along the surface of the substrate is defined as an X direction. A direction intersecting with the X direction along the surface of the substrate is defined as a Y direction. The substrate used in the embodiments of the disclosure may be the SOI substrate 210 shown in FIG. 15. The substrate 210 includes a top-layer silicon 211, a buried oxide layer 212 and a backing substrate 213. The top-layer silicon 211 may be ultra-thin monocrystalline silicon; the buried oxide layer 212 may be silicon oxide; and the backing substrate 213 may be monocrystalline silicon.

Before operation S102 is executed, the substrate may be cleaned to remove impurities on the surface of the substrate.

Then operation S102 is executed, by means of a growth process or a deposition process, the phase-change material layer to be processed and the heating layer to be processed are formed. The heating layer to be processed is located on the substrate, and the phase-change material layer to be processed is located on the heating layer to be processed. Then, by means of an etching process, the phase-change material layer to be processed and the heating layer to be processed are etched to form the required phase-change material layer and the required heating layer, so as to form the phase-change memory cell.

The heating layer in this embodiment of the disclosure includes a first portion composed of a first conductive material and a second portion composed of a second conductive material. The first portion surrounds at least a sidewall of the second portion.

In the embodiments of the disclosure, by using two conductive materials, the advantages of the two conductive materials may be combined, so that a reset current of the PCM is lower, and the heating efficiency is higher. A heater in the embodiments of the disclosure is formed by using the first portion to surround at least a sidewall of the second portion. By means of this structure, the loss of heat can be greatly reduced, thereby further enhancing the heating efficiency.

In some embodiments, the method further includes the following operations.

At S201, a thermal insulation layer is formed to cover a sidewall and at least partial upper surface of the phase-change memory cell.

In some embodiments, after operation S102 is executed, the thermal insulation layer may be formed on the sidewall and at least partial upper surface of the phase-change memory cell by means of the deposition process.

In some embodiments, operations S201 and S102 may be executed alternately. That is to say, after the heating layer of the phase-change memory cell is formed, a first thermal insulation layer is first formed on the sidewall of the heating layer; and then, after the phase-change material layer is formed, a second thermal insulation layer is then formed on the sidewall and at least partial upper surface of the phase-change material layer. The thermal insulation layer covering the sidewall and at least partial upper surface of the phase-change memory cell is formed by the first thermal insulation layer and the second thermal insulation layer together.

In some embodiments, the phase-change memory cell further includes a diode. The operation of forming the phase-change memory cell on the substrate includes the following actions.

At S301, the diode perpendicular to the substrate is formed on the substrate.

At S302, the heating layer is formed on the diode.

At S303, the phase-change material layer is formed on the heating layer.

The phase-change memory cell further includes the diode that is located between the substrate and the heating layer. Therefore, operation S102 may further be divided into operations S301, S302 and S303.

Firstly, operation S301 of forming the diode perpendicular to the substrate on the substrate is executed. Then operation S302 of forming the heating layer on the diode is executed. Finally, operation S303 of forming the phase-change material layer on the heating layer is executed.

In some embodiments, operation S301 of forming the diode perpendicular to the substrate on the substrate includes the following actions.

At S401, a first ion implantation layer is formed on the substrate.

At S402, a second ion implantation layer is formed on the first ion implantation layer. An ion type of the first ion implantation layer is opposite to an ion type of the second ion implantation layer.

At S403, the first ion implantation layer and the second ion implantation layer are etched to form a first ion implantation structure and a second ion implantation structure, so as to form the diode.

Executed operation S301 may include operations S401, S402 and S403.

In some embodiments, operation S401 may be first executed. The first ion implantation layer is formed by means of the growth process (for example, epitaxial growth) and the ion implantation process.

Then, operation S402 is continuously executed. The second ion implantation layer is formed on the first ion implantation layer by means of the growth process (for example, epitaxial growth) and the ion implantation process.

In some embodiments, an epitaxial growth layer may be formed by means of the growth process. Then, ion implantation with different depths is performed on the epitaxial growth layer for two times, so as to form the first ion implantation layer and the second ion implantation layer.

Since the first ion implantation layer and the second ion implantation layer are subsequently configured to form the diode, the ion types of the first ion implantation layer and the second ion implantation layer are opposite.

After the first ion implantation layer and the second ion implantation layer are formed, operation S403 of etching the first ion implantation layer and the second ion implantation layer to form the diode composed of the first ion implantation structure and the second ion implantation structure is executed. Specifically, photoresist may be coated on the second ion implantation layer. A mask (a pattern on the mask being opaque) is used to align with the photoresist layer. When the photoresist is positive photoresist, an exposed portion of the photoresist changes from an insoluble substance to a soluble substance. The dissolved portion may be removed by using a chemical solvent, so that an island area is left on the photoresist layer. The island area corresponds to the opaque portion of the mask. A shape of the island area is the shape of the diode. The diode includes the first ion implantation structure and the second ion implantation structure.

In some embodiments, operation S402 of forming the second ion implantation layer includes the following actions.

At S501, a lower-layer second ion implantation layer is formed.

At S502, an upper-layer second ion implantation layer located on the lower-layer second ion implantation layer is formed. An ion concentration of the upper-layer second ion implantation layer is different from an ion concentration of the lower-layer second ion implantation layer.

In some embodiments, operation S402 may be replaced with operations S501 and S502.

In some embodiments, after operation S401 is executed, operation S501 of forming the lower-layer second ion implantation layer by means of the growth process (for example, epitaxial growth) and the ion implantation process may be executed first. Then, operation S502 of forming the upper-layer second ion implantation layer by means of the growth process (for example, epitaxial growth) and the ion implantation process is continuously executed.

In some embodiments, the epitaxial growth layer may be formed by means of the growth process. Then, ion implantation with different depths is performed on the epitaxial growth layer for three times, so as to form the first ion implantation layer, the lower-layer second ion implantation layer and the upper-layer second ion implantation layer. Types of ions implanted in the upper-layer second ion implantation layer and ions implanted in the lower-layer second ion implantation layer may be the same, but concentrations of the ions implanted may be different.

In some embodiments, the ion concentration of the upper-layer second ion implantation structure may be greater than the ion concentration of the lower-layer second ion implantation structure. Doping the upper-layer second ion implantation structure with high-concentration ions may be used to increase the conductivity of a PN junction in the diode. The lower-layer second ion implantation structure may adjust a threshold voltage of the diode by means of the doped ion concentration and thickness of the lower-layer second ion implantation structure.

In some embodiments, operation S302 of forming the heating layer on the diode includes the following actions.

At S601, a first conductive layer is formed on the second ion implantation layer.

At S602, the first conductive layer is etched to form a plurality of groove structures.

At S603, the second conductive material is filled in the groove structures to form the second portion.

At S604, partial first conductive layer other than the second portion is etched, to form the first portion.

In some embodiments, after operations S401 and S402 are executed, operation S403 may not be executed first, but operation S302 is continuously executed. Operation S302 includes operations S601, S602, S603 and S604.

Operation S601 is first executed. The first conductive material (for example, TaN) is deposited by means of the deposition process, so as to form the first conductive layer located on the second ion implantation layer. Then, operation S602 is executed. The first conductive layer is etched to form the plurality of groove structures. The groove structure may penetrate the first conductive layer, or may not penetrate the first conductive layer. Operation S603 is continuously executed. The second conductive material is filled in the groove structure by means of the deposition process, so as to form the second portion. In some embodiments, when the second conductive material (for example, TiN) is filled in the groove structure, the second conductive material may further cover a surface of the first conductive layer. In this case, the second conductive material covering the surface of the first conductive layer may be removed by means of a CMP process. Operation S604 of etching the partial first conductive layer other than the second portion so as to form the first portion is continuously executed. Specifically, photoresist may be coated on the first conductive layer on which the first portion is formed. A mask (a pattern on the mask being opaque) is used to align with the photoresist layer. When the photoresist is positive photoresist, an exposed portion of the photoresist changes from an insoluble substance to a soluble substance. The dissolved portion may be removed by using a chemical solvent, so that an island area is left on the photoresist layer. The island area corresponds to the opaque portion of the mask. The shape of the island area is the shape of the heating layer. In the embodiments of the disclosure, the use of the TiN/TaN structure to shape a contact cross-sectional area to reduce also facilitates the shrinking of process.

In some embodiments, the substrate includes a backing substrate, a buried oxide layer located on the backing substrate, and a top-layer silicon located on the buried oxide layer. Before operation S102 of forming the phase-change memory cell on the substrate, the method further includes the following operations.

At S701, the top-layer silicon is doped to form a doped layer. The doped layer includes an N well layer, a P well layer and a third ion implantation layer.

At S702, the doped layer is etched to form a plurality of doped structures; the doped structure includes an N well, a P well and a third ion implantation structure; the third ion implantation structure is connected to the first ion implantation structure in the first direction; and a shallow trench isolation structure is formed to fill the groove between the adjacent doped structures.

Before operation S102 is executed, operation S701 of forming the doped layer on the buried oxide layer may also be executed. The doped layer is formed by performing multiple ion implantation and/or thermal diffusion processes on the top-layer silicon. Then operation S702 is executed. The doped layer may be etched in the first direction parallel to the substrate to form the plurality of doped structures, each of which is composed of the N well, the P well and the third ion implantation structure. The third ion implantation structure is connected to the first ion implantation structure in the first direction. That is to say, the plurality of third ion implantation structures are parallel to each other in the first direction. The formed third ion implantation structure is connected to the plurality of first ion implantation structures, so that the plurality of phase-change memory cells located in the same first direction are connected to the same third ion implantation structure.

In some embodiments, the method further includes the following operations.

At S801, the groove between the adjacent doped structures is filled, to form a shallow trench isolation structure.

The doped structures extend in the first direction, and also arranged in the second direction. There is a groove between the adjacent doped structures in both the first direction and the second direction. Operation S801 is executed. By means of the deposition process, oxide, nitride or a combination thereof is deposited to fill the groove, so as to form the shallow trench isolation structure. In this way, there is a shallow trench isolation structure between the adjacent doped structures in both the first direction and the second direction. The shallow trench isolation structure is configured to electrically isolate the doped structure and a device (for example, the phase-change memory cell) that is subsequently formed on the doped structure.

In some embodiments, the method further includes the following operations.

At S901, an interlayer dielectric layer is formed, and the interlayer dielectric layer is filled among the plurality of phase-change memory cells.

At S902, a first conductive structure is formed, to penetrate the interlayer dielectric layer and connect the third ion implantation structure.

In some embodiments, operation S901 may be executed after operation S102 is executed. By means of the deposition process, the insulation material is deposited among the plurality of phase-change memory cells, so as to form the interlayer dielectric layer.

In some embodiments, operations S102 and S901 may be alternately executed. For example, after the diode and the heating layer are formed, the insulation material may be first deposited between the diode and the heating layer, so as to form a first interlayer dielectric layer. Then, after the phase-change material layer is formed, the insulation material is continuously deposited between the phase-change material layers, so as to form a second interlayer dielectric layer. The interlayer dielectric layer is formed by the first interlayer dielectric layer and the second interlayer dielectric layer together.

Then, operation S902 is executed. The interlayer dielectric layer is etched, and the third ion implantation layer may be used as a stop layer for etching. The groove structure penetrating the interlayer dielectric layer is formed after etching, and may be filled by using the conductive material by means of the deposition process, so as to form the first conductive structure that penetrates the interlayer dielectric layer and is connected to the third ion implantation structure. The first conductive structure includes at least a first CT. In some embodiments, the first conductive structure may further include a first conductive plug above the first CT.

In some embodiments, the method further includes the following operations.

At S1001, a second conductive structure is formed to connect to the phase-change memory cell.

The first conductive structure is connected to a first conductive wire that extends in a first direction parallel to the substrate; the second conductive structure is connected to a second conductive wire that extends in a second direction parallel to the substrate; and the second direction intersects with the first direction.

After operation S102 is executed, operation S1001 may be continuously executed to form the second conductive structure that is connected to the surface of the phase-change memory cell. The second conductive structure includes at least a second CT. In some embodiments, the second conductive structure may further include a second conductive plug above the second CT.

In some embodiments, a first conductive wire may further be formed on the first conductive structure by means of the deposition process. The first conductive wire extends in the first direction parallel to the substrate. A second conductive wire may further be formed on the second conductive structure by means of the deposition process. The second conductive wire extends in the second direction parallel to the substrate. In the embodiments of the disclosure, the first conductive wire may be a bit line, and the second conductive wire may be a word line. Alternatively, the first conductive wire may be the word line, and the second conductive wire may be the bit line.

In the embodiments of the disclosure, there are also the following examples.

Figure 15:
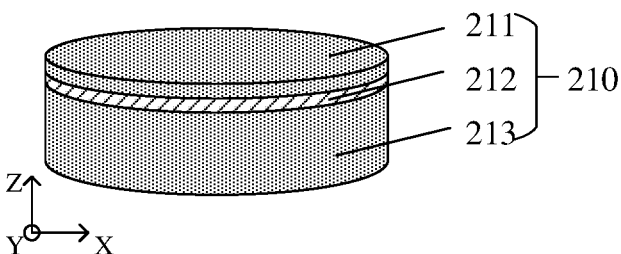
FIG. 15 is a schematic diagram of a substrate according to an embodiment of the disclosure.

First, operation S101 is executed. The substrate 210 shown in FIG. 15 is provided, and the substrate may be an SOI substrate. The thickness direction of the substrate or the direction perpendicular to the surface of the substrate is defined as a Z direction. Any direction along the surface of the substrate is defined as an X direction. A direction intersecting with the X direction along the surface of the substrate is defined as a Y direction. After the substrate is provided, the substrate may also be cleaned to remove impurities on the surface of the substrate. The SOI substrate 210 includes the backing substrate 213, the buried oxide layer 212 and the top-layer silicon 211.

Then, operation S701 is executed. Ion implantation with different depths is performed on the top-layer silicon from the upper surface of the substrate for three times, so as to form the doped layer. The doped layer includes the N well layer, the P well layer and the third ion implantation layer. An ion implantation depth of the N well layer is greater than an ion implantation depth of the P well layer, and is greater than an ion implantation depth of the third ion implantation layer.

Then, operation S702 of etching the doped layer to form the plurality of doped structures is executed. The doped structure includes the N well, the P well and the third ion implantation structure. The third ion implantation structure is connected to the first ion implantation structure in the first direction. The doped layer is etched in the X direction to form the plurality of doped structures. In this case, there is a groove between the adjacent doped structures.

Then, operation S801 of filling the groove between the adjacent doped structures to form the shallow trench isolation structure is executed.

In the embodiments of the disclosure, a non-device area of the doped structure may also be etched in the Y direction. Two grooves on two sides of a device area may be formed in the Y direction after etching. A phase-change memory cell array may be continuously formed on the doped structure of the device area between the two grooves. Then, the grooves on the two sides of the device area are filled by means of the deposition process, so as to form two shallow trench isolation structures in the Y direction. The number in the above embodiment is merely schematic. The groove structures of other numbers may also be formed in the Y direction of the non-device area.

Figure 16:
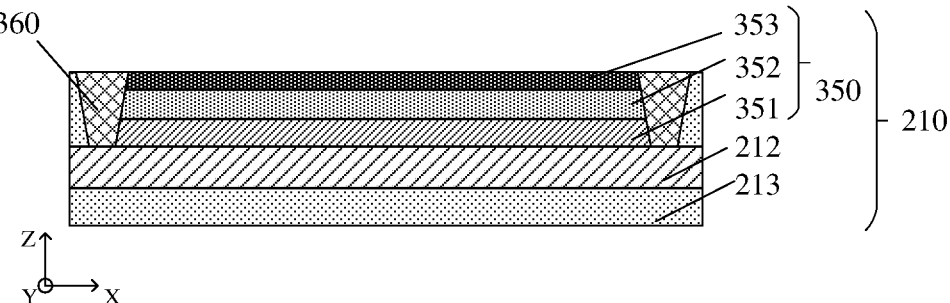
FIG. 16 is a first schematic cross-sectional view of a semiconductor structure according to an embodiment of the disclosure.
Figure 17:
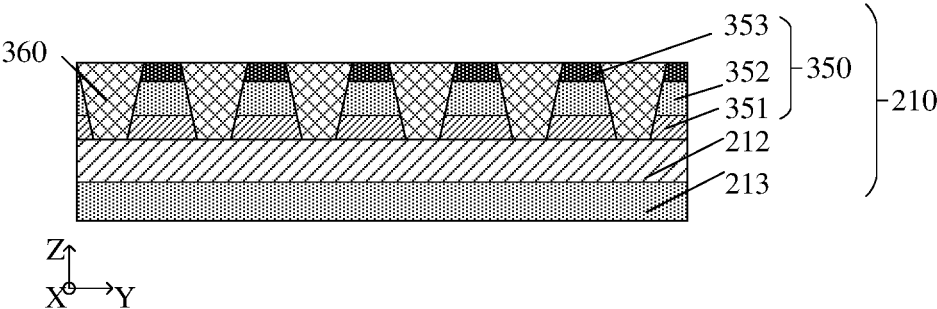
FIG. 17 is a second schematic cross-sectional view of a semiconductor structure according to an embodiment of the disclosure.

The semiconductor structure formed after executing the above operations is shown in FIG. 16 and FIG. 17. FIG. 16 is a cross-sectional view of the semiconductor structure in the X direction. FIG. 17 is a cross-sectional view of the semiconductor structure in the Y direction.

In FIG. 16, by viewing from a positive direction of a Z axis, the backing substrate 213, the buried oxide layer 212 and the doped structure 350 (including the N well 351, the P well 352 and the third ion implantation structure 353) are successively shown. Two ends of the doped structure 350 further include two shallow trench isolation structures 360. An area between the two shallow trench isolation structures 360 may be used as the device area, which is subsequently used to form a semiconductor element, for example, the phase-change memory cell.

In FIG. 17, by viewing from the positive direction of the Z axis, the backing substrate 213, the buried oxide layer 212, the plurality of shallow trench isolation structures 360 and a doped structure 350 between the shallow trench isolation structures 360 are successively shown. The shallow trench isolation structure 360 and the doped structure 350 are located in the same horizontal direction in the Z direction.

Figure 18:
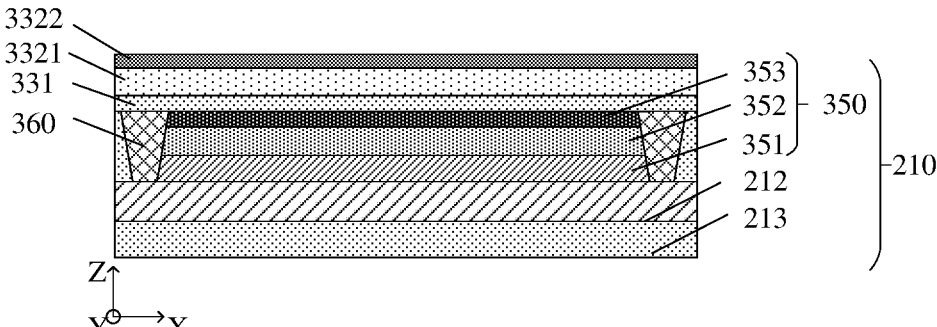
FIG. 18 is a third schematic cross-sectional view of a semiconductor structure according to an embodiment of the disclosure.
Figure 19:
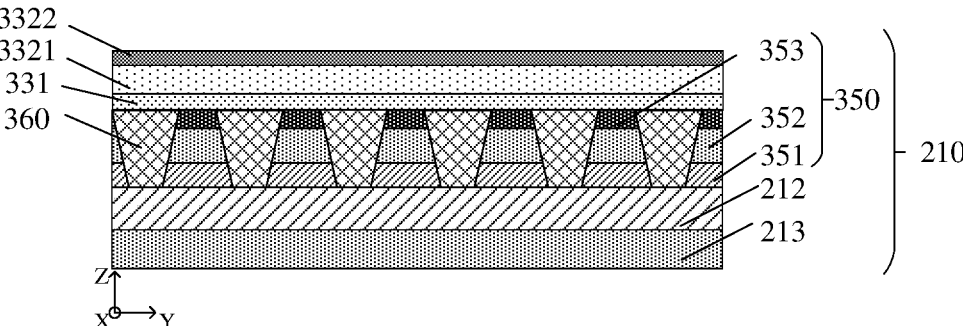
FIG. 19 is a fourth schematic cross-sectional view of a semiconductor structure according to an embodiment of the disclosure.

Then, operation S401 is executed. Epitaxial growth is performed on the semiconductor structure shown in FIG. 16 and FIG. 17 to form a first epitaxially-grown silicon layer, and then highly doped N-type ions are implanted, so as to form the first ion implantation layer 331 shown in FIG. 18 and FIG. 19. FIG. 18 is a cross-sectional view of the semiconductor structure in the X direction. FIG. 19 is a cross-sectional view of the semiconductor structure in the Y direction.

Then, operation S501 is executed. Epitaxial growth is continuously performed on the first ion implantation layer 331 to form a second epitaxially-grown silicon layer, and then the N-type ions are implanted, so as to form the lower-layer second ion implantation layer 3321 shown in FIG. 18 and FIG. 19.

Then, operation S502 is executed. Epitaxial growth is continuously performed on the lower-layer second ion implantation layer 3321 to form a third epitaxially-grown silicon layer, and then the highly doped P-type ions are implanted, so as to form the upper-layer second ion implantation layer 3332 shown in FIG. 18 and FIG. 19.

Then, operation S601 is executed. The first conductive material (for example, TaN) is deposited by means of the deposition process (such as CVD), so as to form the first conductive layer located on the second ion implantation layer.

Then, operation S602 is executed. Processes of photomask and etching are used to process the first conductive layer, so as to form the plurality of groove structures penetrating the first conductive layer. Then, the surface of the formed groove structure may also be washed to remove a native oxide layer on the surface.

Figure 20:
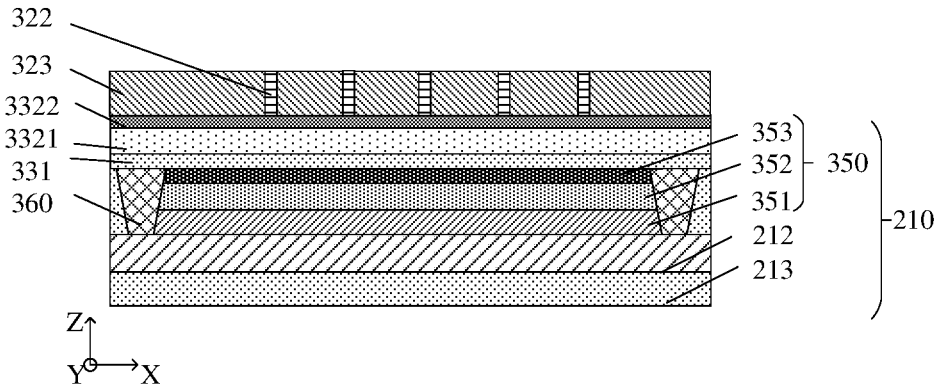
FIG. 20 is a fifth schematic cross-sectional view of a semiconductor structure according to an embodiment of the disclosure.

Then, operation S603 is executed. The second conductive material (for example, TiN) is deposited in the groove structure by means of the deposition process (such as atomic layer deposition), so as to form the second portion 322 shown in FIG. 20 and FIG. 21. FIG. 20 is a cross-sectional view of the semiconductor structure in the X direction. FIG. 21 is a cross-sectional view of the semiconductor structure in the Y direction. In some embodiments, the TiN is also deposited on the TaN layer (that is, the first conductive layer). In this case, chemical mechanical polishing may be performed on the TiN deposited on the TaN layer (that is, the first conductive layer), until the TaN layer is exposed.

Then, operations S604 and S403 are executed. The photomask and etching processes are used to etch partial first conductive layer other than the second portion, and the first ion implantation layer and the second ion implantation layer under the partial first conductive layer, and the etching stop layer is the third ion implantation structure, so that the heating layer 320 and the diode 330 shown in FIG. 22 and FIG. 23 are formed. A three-dimensional structure of the heating layer 320 is shown in FIG. 24, and includes the second portion 322 and the first portion 321. The second portion 322 may be of a cylindrical structure. The first portion 321 may be a cuboid with a cylinder cut out in the middle. It may be seen that, the first portion 321 covers the entire sidewall of the second portion 322.

Then, operation S201 is executed. A thermal insulation material (for example, SiN) is deposited to form a first thermal insulation layer 410. By viewing in the X direction, as shown in FIG. 25, the first thermal insulation layer may cover a sidewall of the diode 330, a sidewall of the heating layer 320, a surface of the heating layer 320 and a surface of the third ion implantation structure 353. By viewing in the Y direction, as shown in FIG. 26, the first thermal insulation layer may cover the sidewall of the diode 330, the sidewall of the heating layer 320, the surface of the heating layer 320 and a surface of the shallow trench isolation structure 360.

In some embodiments, before operation S201 is executed, the surface of the groove structure between first structures (the heating layer and the diode) may also be washed, so as to remove the native oxide layer on the surface.

Then, operation S901 is executed. The insulation material (for example, SiN) is deposited between the diode and the heating layer, so as to form the first interlayer dielectric layer. When the first interlayer dielectric layer is deposited, the first interlayer dielectric layer 370 may further cover the first thermal insulation layer 410 on the heating layer 320. In this case, the etching process (for example, CMP) may be used to remove the first thermal insulation layer 410 on the heating layer 320 and the first interlayer dielectric layer 370, until the heating layer 320 is exposed. After operation S901 is executed, the semiconductor structure shown in FIG. 27 and FIG. 28 may be formed. FIG. 27 is a cross-sectional view of the semiconductor structure in the X direction. FIG. 28 is a cross-sectional view of the semiconductor structure in the Y direction.

By viewing in the X direction, as shown in FIG. 27, the first thermal insulation layer 410 covers the sidewalls of the heating layer 320 and the diode 330, and the upper surface of the third ion implantation layer 353. There is a first interlayer dielectric layer 370 between the adjacent first structures (the heating layer 320 and the diode 330).

By viewing in the Y direction, as shown in FIG. 28, the first thermal insulation layer 410 covers the sidewalls of the heating layer 320 and the diode 330, and the upper surface of the shallow trench isolation structure 360. There is a first interlayer dielectric layer 370 between the adjacent first structures (the heating layer 320 and the diode 330).

Then, operation S303 is executed. A phase-change material (for example, GST) is first deposited by means of the deposition process, so as to form the phase-change material layer. Then, the phase-change material layer is processed by means of photomask and etching processes, so as to form a phase-change material structure 310 located on the heating layer 320 shown in FIG. 29 and FIG. 30. In some embodiments, a width (in the X direction) and length (in the Y direction) of the phase-change material structure 310 may be greater than the width and length of the heating layer 320, respectively. That is to say, the phase-change material structure 310 may completely cover the upper surface of the heating layer 320.

A distance between the adjacent phase-change material structures that are formed by the method of the embodiments of the disclosure may be reduced to 0.07 μm. The spacing between the phase-change memory cells and the stacked number of the phase-change memory cells are small, so that the density of memory cells per unit area can be greatly increased.

Operation S201 is then executed. The thermal insulation material (SiN) is deposited between the phase-change material structures 310, so as to form a second thermal insulation layer 420 shown in FIG. 31 and FIG. 32. The second thermal insulation layer 420 covers a sidewall and upper surface of the phase-change material structure 310, and an upper surface of the first interlayer dielectric layer 370.

Operation S901 is then executed. An insulation material (for example, silicon oxide) is deposited on the second thermal insulation layer 420, so as to form a second interlayer dielectric layer 371 shown in FIG. 33 and FIG. 34.

Then, Operations S902 and S1001 are executed. As shown in FIG. 35 and FIG. 36, the first conductive structure that penetrates the first interlayer dielectric layer and the second interlayer dielectric layer and is connected to the third ion implantation structure is formed, and the second conductive structure connected to the surface of the phase-change memory cell is formed.

Specifically, the photomask and etching processes are performed between the phase-change memory cell array and the shallow trench isolation structure (which may be selected from any two shallow trench isolation structures in the X direction) in the Y direction; and the third ion implantation structure is used as the etching stop layer, and the plurality of overlapping groove structures parallel to the Y direction are formed in the X direction. The groove structure penetrates the first interlayer dielectric layer and the second interlayer dielectric layer, and is connected to the third ion implantation structure.

On the phase-change memory cell array, in the X direction and the Y direction, the photomask and etching processes are used, and the phase-change material structure is used as the etching stop layer, so as to form an opening structure on the phase-change material structure. A width (in the X direction) of the opening structure is less than or equal to a width of the phase-change material structure, and a length (in the Y direction) of the opening is also less than or equal to a length of the phase-change material structure.

Then, by means of the deposition process (such as atomic layer deposition), the conductive material is deposited to the groove structure and the opening structure, so as to form the first CT 382, the first conductive plug 383, the second CT 392 and the second conductive plug 393.

Then, the conductive material is deposited on the second conductive plug 393, and the second conductive wire 391 covering the second conductive plug 393 is formed by means of the photomask and etching processes. As shown in FIG. 36, the second conductive wire 391 extends in the Y direction. As shown in FIG. the second conductive wires 391 are parallel to each other in the Y direction.

A distance between the adjacent second conductive wires 391 that are formed by the method of the embodiments of the disclosure may be reduced to 0.07 μm.

On the basis of FIG. 35 and FIG. 36, the insulation material (for example, silicon oxide) is continuously deposited to form a third interlayer dielectric layer 372 shown in FIG. 37 and FIG. 38. On the third interlayer dielectric layer 372, the groove structure that penetrates the third interlayer dielectric layer 372 and is connected to the first conductive plug 383 is formed by means of the photomask process and the etching process.

By means of the deposition process (such as atomic layer deposition), another first CT 382 above the first conductive plug 383 and another first conductive plug 383 are formed. An upper surface of the first conductive plug 383 is flush with an upper surface of the third interlayer dielectric layer 372.

Then, the first conductive wires 381 parallel to each other in the X direction are formed on the third interlayer dielectric layer by means of the photomask process and the etching process.

In the embodiments of the disclosure, the insulation materials used by the first interlayer dielectric layer, the second interlayer dielectric layer and the third interlayer dielectric layer may be the same or different.

The top view of the semiconductor structure shown in FIG. 37 and FIG. 38 is shown in FIG. 39. The bit line extends in the Y direction, and the adjacent bit lines are parallel to each other in the X direction.

The word line extends in the X direction, and the adjacent word lines are parallel to each other in the Y direction.

In conclusion, the semiconductor structure formed by using the method of the embodiments of the disclosure is simple in process and easy to form. In addition, since the semiconductor structure is formed on the SOI substrate, in addition to the above advantages, the semiconductor structure further has the advantages of SOI (for example, less latch-up effect, less leakage current, and the like). A circuit diagram corresponding to the semiconductor structure shown in FIG. 37 and FIG. 38 may be simplified as that shown in FIG. 40. A memory cell 500 includes a phase-change memory cell and a diode. A plurality of diodes located at the same row may be connected to the same word line, and a plurality of phase-change memory cells located at the same column may be connected to the same bit line.

A programming operation that is performed on the memory cell 500 includes: applying a programming voltage $V_{pgm}$ (for example, 0.5 V) to the bit line at which the selected memory cell 500 is located, and applying an earth voltage (for example, 0 V) to other unselected bit lines. At the same time, the earth voltage (for example, 0 V) is applied to the word line at which the selected memory cell 500 is located, and a certain voltage (for example, 0.5 V) is applied to the unselected word line.

A read operation that is performed on the memory cell includes: applying a read voltage ($V_{read}$) to the bit line at which the selected memory cell 500 is located, and applying the earth voltage (for example, 0 V) to other unselected bit lines. At the same time, the earth voltage (for example, 0 V) is applied to the word line at which the selected memory cell 500 is located, and a certain voltage (for example, 0.5 V) is applied to the unselected word line, where $V_{read}$ is less than $V_{pgm}$.

An IV curve of the memory cell is shown in FIG. 41.

Curve 1 is a current-voltage curve when a read operation is performed on the memory cell.

Curve 2 is a current-voltage curve when a write operation is performed on the memory cell.

The current-voltage curves shown in FIG. 41 show that, the read voltage must be less than a write voltage (for example, a range of the write voltage being in a shadow area). In this way, when data is read, the transition of the PCM cannot be caused by excessive voltage. Generally, the write operation is classified into a RESET operation and a SET operation, and the voltage range is probably in the shadow area. Then, a write action is done at different pulse times. The SET operation may have the longer pulse time, and the RESET may have the shorter pulse time.

Finally, an embodiment of the disclosure further provides a memory. As shown in FIG. 42, the memory 40 includes a memory cell array 20 and a peripheral circuit 30 structure located above or outside the memory cell array 20; where the memory cell array 20 includes the semiconductor structure 10 described in any one of the above embodiments.

The entire or partial structure of the semiconductor structure 10 in the above embodiment may be used to form the memory cell array 20, and memory cells of the memory cell array 20 include phase-change memory cells.

The peripheral circuit 30 may include any suitable analog, digital, and mixed-signal circuits, so as to perform related operations on the memory cell array 20. The operations include reading, writing, erasing, and the like.

The memory 40 may be a PCM.

The memory is of a three-dimensional structure, which has higher storage density, lower power consumption and easier access operation. A heater of the memory has a smaller size, so that heating efficiency can be higher, and a write speed can be faster. The memory further has other advantages of the semiconductor structure described in any one of the above embodiments of the disclosure.

The characteristics disclosed in several method or device embodiments provided in the disclosure can be combined arbitrarily without conflict to obtain a new method embodiment or device embodiment.

The above is only the specific implementations of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

In the embodiments of the disclosure, two conductive materials are used to form the heating layer, and the heating layer has the first portion and the second portion. In addition, the first portion surrounds at least a sidewall of the second portion. In this way, heating efficiency can be enhanced by using the advantage of the conductive material of the second portion, and heat is not easy to dissipate after heating by using the first portion to surround the second portion, thereby facilitating the further enhancement of the heating efficiency. After the heating efficiency is enhanced, the enhanced heating efficiency can shorten the time required for the phase transition of the phase-change material layer, so that the occurrence of phase transition can be faster, thereby accelerating the rate of data writing.

What is claimed is:

1. A method for forming a semiconductor structure, comprising:

providing a substrate;

forming a phase-change memory cell on the substrate, wherein the phase-change memory cell comprises a phase-change material layer, a heating layer and a diode, the heating layer being located between the phase-change material layer and the substrate, and the heating layer comprises a first portion composed of a first conductive material and a second portion composed of a second conductive material, and the first portion surrounds at least a sidewall of the second portion;

wherein the forming a phase-change memory cell on the substrate comprises:

forming, on the substrate, the diode perpendicular to the substrate, including:

forming a first ion implantation layer on the substrate;

forming a second ion implantation layer on the first ion implantation layer, including: forming a lower-layer second ion implantation layer; and forming an upper-layer second ion implantation layer on the lower-layer second ion implantation layer, wherein an ion concentration of the upper-layer second ion implantation layer is different from an ion concentration of the lower-layer second ion implantation layer, an ion type of the first ion implantation layer is opposite to an ion type of the second ion implantation layer; and etching the first ion implantation layer and the second ion implantation layer to form a first ion implantation structure and a second ion implantation structure, to form the diode;

forming the heating layer on the diode; and forming the phase-change material layer on the heating layer.

2. The method of claim 1, further comprising:

forming a thermal insulation layer to cover a sidewall and at least partial upper surface of the phase-change memory cell.

3. The method of claim 1, wherein forming the heating layer on the diode comprises:

forming a first conductive layer on the second ion implantation layer;

etching the first conductive layer to form a plurality of groove structures;

filling the second conductive material in the groove structures to form the second portion; and etching partial first conductive layer other than the second portion, to form the first portion.

4. The method of claim 1, wherein the substrate comprises a backing substrate, a buried oxide layer located on the backing substrate, and a top-layer silicon located on the buried oxide layer; and wherein the method further comprises: before forming the phase-change memory cell on the substrate, doping the top-layer silicon to form a doped layer, wherein the doped layer comprises an N well layer, a P well layer and a third ion implantation layer;

etching the doped layer to form a plurality of doped structures, wherein the doped structure comprises N well, a P well and a third ion implantation structure, and the third ion implantation structure is connected to the first ion implantation structure; and forming a shallow trench isolation structure, to fill a groove between adjacent doped structures.

5. The method of claim 4, further comprising:

forming an interlayer dielectric layer, and filling the interlayer dielectric layer among a plurality of phase-change memory cells; and forming a first conductive structure, to penetrate the interlayer dielectric layer and connect the third ion implantation structure.

6. The method of claim 5, further comprising:

forming a second conductive structure to connect to the phase-change memory cell, wherein the first conductive structure is connected to a first conductive wire that extends in a first direction parallel to the substrate, the second conductive structure is connected to a second conductive wire that extends in a second direction parallel to the substrate, and the second direction intersects with the first direction.

* * * * *